US012659629B2

(12) United States Patent
An et al.

(10) Patent No.: US 12,659,629 B2
(45) Date of Patent: Jun. 16, 2026

(54) SOLID-STATE IMAGING DEVICE WITH RAMP GENERATOR CIRCUIT

(71) Applicant: Sony Semiconductor Solutions Corporation, Kanagawa (JP)

(72) Inventors: Jae-Sung An, Oslo (NO); Naoki Kawazu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/728,482

(22) PCT Filed: Jan. 18, 2023

(86) PCT No.: PCT/EP2023/051115
§ 371 (c)(1),
(2) Date: Jul. 12, 2024

(87) PCT Pub. No.: WO2023/143981
PCT Pub. Date: Aug. 3, 2023

(65) Prior Publication Data
US 2025/0113120 A1      Apr. 3, 2025

(30) Foreign Application Priority Data
Jan. 25, 2022    (EP) ..................................... 22153200

(51) Int. Cl.
*H04N 25/78*          (2023.01)
*H03M 1/36*           (2006.01)
(Continued)

(52) U.S. Cl.
CPC ............ *H04N 25/78* (2023.01); *H03M 1/362* (2013.01); *H03M 1/365* (2013.01); *H03M 1/56* (2013.01); *H04N 25/709* (2023.01)

(58) Field of Classification Search
CPC ..... H04N 25/709; H04N 25/78; H03M 1/362; H03M 1/365; H03M 1/56
See application file for complete search history.

(56) References Cited

U.S. PATENT DOCUMENTS 8,462,036 B2 * 6/2013 Narathong ........... H03B 5/1228
                                              331/34
8,482,448 B2 * 7/2013 Burm ...................... H03M 1/08
                                              341/169

(Continued)

FOREIGN PATENT DOCUMENTS

JP        2018-093480 A      6/2018
KR   10-2014-0085239 A      7/2014

OTHER PUBLICATIONS

International Search Report and Written Opinion mailed on Mar. 2, 2023, received for PCT Application No. PCT/EP2023/051115, filed on Jan. 18, 2023, 10 pages.

*Primary Examiner* — Lin Ye
*Assistant Examiner* — Chriss S Yoder, III
(74) *Attorney, Agent, or Firm* — XSENSUS LLP

(57) ABSTRACT

Pixel circuits of a solid-state imaging device are arranged in pixel columns, wherein, for each pixel column, signal outputs of the pixel circuits are connected to a data signal line. The solid-state imaging device further includes comparator circuits, wherein each comparator circuit generates an active comparator signal in response to a voltage difference between a first comparator input and a second comparator input. Each first comparator input is connected to one of the data signal lines. A ramp generator circuit includes at least one resistor network and buffer circuits. The ramp generator circuit generates a voltage ramp signal based on voltages at voltage tap nodes of the at least one resistor network. Each (Continued)

buffer circuit passes a buffered voltage ramp signal to the second comparator input of at least one of the comparator circuits.

20 Claims, 16 Drawing Sheets

(51) Int. Cl.
 *H03M 1/56* (2006.01)
 *H04N 25/709* (2023.01)

(56) References Cited

U.S. PATENT DOCUMENTS

| | | | | |
|---|---|---|---|---|
| 10,084,982 B2 * | 9/2018 | Kim | ..................... | H04N 25/677 |
| 2003/0112167 A1 * | 6/2003 | Bae | ........................ | H04N 25/78 |
| | | | | 341/154 |
| 2006/0001564 A1 | 1/2006 | Yamagata et al. | | |
| 2008/0296473 A1 * | 12/2008 | Yamaoka | .............. | H03K 4/023 |
| | | | | 323/350 |
| 2009/0033759 A1 * | 2/2009 | Wakabayashi | ......... | H04N 25/00 |
| | | | | 348/222.1 |
| 2020/0014873 A1 | 1/2020 | Abe et al. | | |

\* cited by examiner

244uV/LSB

1500mV

500mV

D

P

6144

| 1024 | 1024 | 1024 | 1024 | 1024 | 2048 |
|------|------|------|------|------|------|
| -6dB | 0dB | 6dB | 12dB | 18dB | 24dB |

2048
D(24dB)

1000mV
4096

500mV

250mV

125mV 62.5 mV 31.25mV 31.25mV

D

P

P1  P2  P3  P4  P5  P6

SOLID-STATE IMAGING DEVICE WITH RAMP GENERATOR CIRCUIT

CROSS-REFERENCE TO RELATED APPLICATIONS

The present application is based on PCT filing PCT/EP2023/051115, filed Jan. 18, 2023, which claims priority from European Patent Application No. 22153200.5, filed Jan. 25, 2022, the entire contents of each are incorporated herein by reference.

The present disclosure relates to a solid-state imaging device. More particularly, the present disclosure relates to a solid-state imaging device including an analog-to-digital converter with a ramp generator circuit.

BACKGROUND

Image sensors in solid-state imaging devices include photoelectric conversion elements generating a photocurrent in proportion to the received radiation intensity. A pixel circuit transforms the small photocurrent generated by the photoelectric conversion element into a voltage signal (pixel output signal) and outputs the pixel output signal on a data line (vertical signal line). A downstream ADC (analog-to-digital converter) converts the analog pixel output signal into a digital pixel value. The ADC may be a ramp compare ADC that includes a ramp generator circuit, a comparator circuit and a counter. The comparator circuit compares the pixel output signal with a voltage ramp generated by the ramp generator circuit and outputs an active comparator signal when the voltage ramp exceeds or falls below the pixel output signal. The counter counts events that occur at regular intervals in a count period between the start of the voltage ramp and the start of the active comparator signal. The count value at the end of the count period gives the result of the analog-to-digital conversion and defines the digital pixel value.

The data signal line is shared by a plurality of pixel circuits assigned to the same pixel column and the pixel output signals of each pixel column are output individually in a time multiplex regime. A column signal processing unit including the ADC sequentially receives and processes the pixel output signals of the pixels assigned to the same pixel column.

SUMMARY

In a solid-state imaging device having a single ramp generator circuit, the voltage ramp signal is transmitted to a plurality of comparator circuits associated with different pixel columns and spaced at different distances from the ramp generator circuit. The different distances result in different RC parasitics on the conductive paths, so that the voltage ramp signals at the inputs of the comparator signals may differ from each other. As a result, different pixel columns may convert the same light intensity into different digital pixel values.

The present disclosure mitigates shortcomings of analog-to-digital converters used for the intensity read-out, in particular for the intensity read-out of high dynamic range pixels.

To this purpose, a solid-state imaging device according to the present disclosure includes pixel circuits and comparator circuits. The pixel circuits are arranged in pixel columns. For each pixel column, outputs of the pixel circuits are connected to a data signal line. Each comparator circuit generates an active comparator signal in response to a voltage difference between a first comparator input and a second comparator input, wherein each first comparator input is connected to one of the data signal lines. The solid-state imaging device further includes a ramp generator circuit that includes at least one resistor network and buffer circuits. The ramp generator circuit generates a voltage ramp signal based on voltages at voltage tap nodes of the at least one resistor network. Each buffer circuit buffers the voltage ramp signal and passes a buffered voltage ramp signal to the second comparator input of at least one of the comparator circuits.

In particular, at least an output portion of the ramp generator may be divided into a plurality of identical second parts. Each second part includes at least a buffer circuit and may transmit a buffered voltage ramp signal to one or more of the comparator circuits. The differences among buffer-to-comparator distances are comparatively small. As a consequence, the differences between RC parasitics for different comparator input signals and the differences between the voltage ramp signals applied to the inputs of comparator circuits assigned to different pixel columns are small. A more uniform radiation conversion can be achieved across different pixel columns, in particular in solid-state imaging devices with a high number of pixel circuits and/or in solid-state imaging devices with high dynamic range.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 is a simplified block diagram showing a solid-state imaging device with a ramp generator circuit according to an embodiment of the present technology.

DETAILED DESCRIPTION

Figure 2:
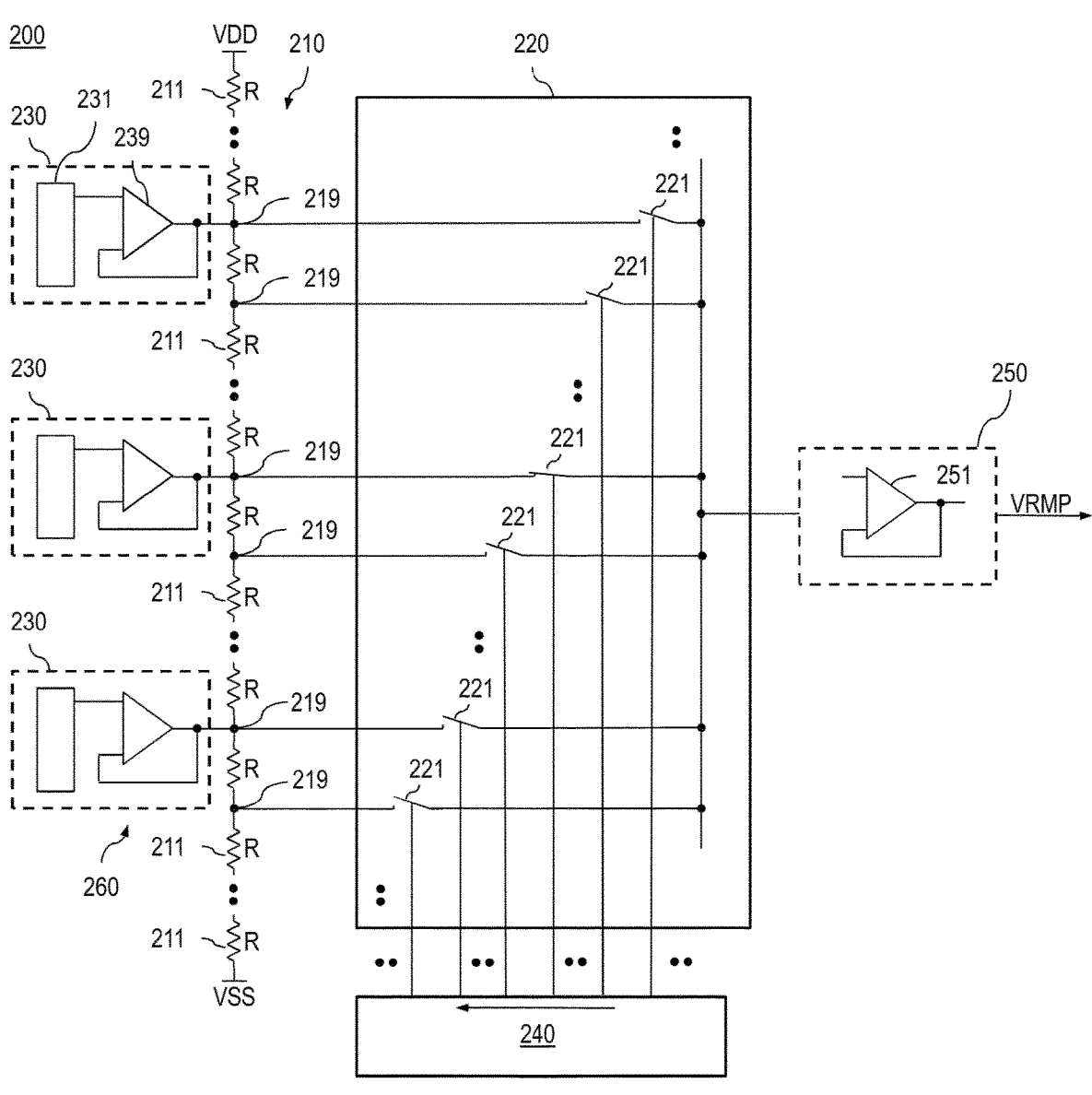
FIG. 2 is a simplified circuit diagram showing a basic configuration of a ramp generator circuit with reference voltage circuits according to an embodiment.

Embodiments for implementing techniques of the present disclosure (also referred to as "embodiments" in the following) will be described below in detail using the drawings. The techniques of the present disclosure are not limited to the described embodiments, and various numerical values and the like in the embodiments are illustrative only. The same elements or elements with the same functions are denoted by the same reference signs. Duplicate descriptions are omitted.

Connected electronic elements may be electrically connected through a direct, permanent low-resistive connection, e.g., through a conductive line. The terms "electrically connected" and "signal-connected" may also include a connection through other electronic elements provided and suitable for permanent and/or temporary signal transmission and/or transmission of energy. For example, electronic elements may be electrically connected or signal-connected through resistors, capacitors, and electronic switches such as transistors or transistor circuits, e.g. FETs (field effect transistors), transmission gates, and others. The load path of a transistor is the controlled path of a transistor. For example, a voltage applied to a gate of a FET controls by field effect the current flow through the load path between source and drain.

Though in the following a technology for improving image quality is described in the context of certain types of image sensors for high dynamic range intensity read-out, the technology may also be used for other types of image sensors.

Figure 1:
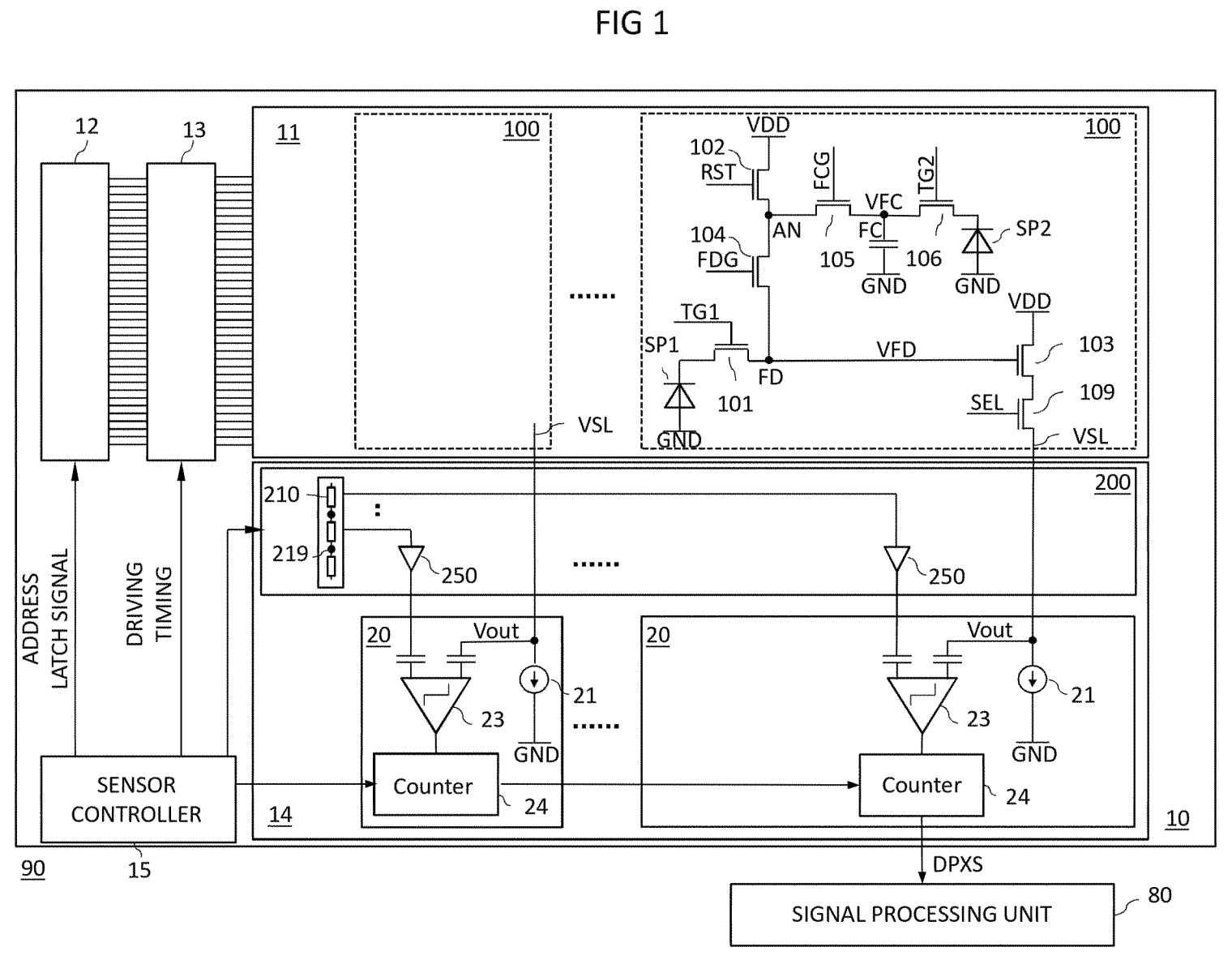

FIG. 1 illustrates a configuration example of a solid-state imaging device 90 including an image sensor assembly 10 and a signal processing unit 80 according to an embodiment of the present technology.

The image sensor assembly 10 may include a pixel array unit 11, a row decoder 12, a pixel driver unit 13, a column signal processing unit 14, and a sensor controller 15.

The pixel array unit 11 includes a plurality of identical pixel circuits 100. The pixel circuit 100 may be any active pixel sensor for intensity read-out, e.g. high dynamic range intensity read-out. In the illustrated embodiment, each pixel circuit 100 includes a first photoelectric conversion element SP1 and a second photoelectric conversion element SP2 and a number of FETs for controlling the output signal of the pixel circuit 100. The first photoelectric conversion element SP1 has a higher sensitivity to electromagnetic radiation than the second photoelectric conversion element SP2.

The first photoelectric conversion devices SP1 of the pixel array unit 11 may be arranged matrix-like in columns and rows. A subset of pixel circuits 100 assigned to the same column of first photoelectric conversion devices SP1 forms a pixel column. The output signals of the pixel circuits 100 of the same pixel column are successively supplied to a data signal line (vertical signal line) VSL.

The row decoder 12 and the pixel driver unit 13 control driving of each pixel circuit 100 disposed in the pixel array unit 11. In particular, the row decoder 12 may supply control signals for selecting a the pixel circuit 100 or the row of pixel circuits 100 to be driven to the pixel driver unit 13 according to an address latch signal from the sensor controller 15. The pixel driver unit 13 may control the FETs of the selected pixel circuit 100 or the FETs of the selected pixel row according to driver timing signals supplied from the sensor controller 15 and the control signals supplied from the row decoder 12.

The data signal lines VSL pass the output signals of the pixel circuits 100 (pixel output signals Vout) to the column signal processing unit 14.

The column signal processing unit 14 may include one or more ADC (analog-to-digital converters) units 20. The column signal processing unit 14 may include as much ADC units 20 as the pixel array unit 11 includes data signal lines VSL. Alternatively, the number of ADC units 20 may be lower than the number of data signal lines VSL and each ADC unit 20 may be multiplexed between two or more of the data signal lines VSL. Each ADC unit 20 performs an analog-to-digital conversion of the pixel output signals successively passed from the pixel column into digital pixel values and passes digital pixel data DPXS containing the digital pixel values to the signal processing unit 80.

The sensor controller 15 controls the components of the image sensor assembly 10. For example, the sensor controller 15 may generate and pass the address latch signals to the row decoder 12, and may generate and pass driving timing signals to the pixel driver unit 13.

In each pixel circuit 100, each of the photoelectric conversion elements SP1, SP2 photoelectrically converts incident electromagnetic radiation into electric charges. The amount of electric charge generated in the photoelectric conversion element SP1, SP2 corresponds to the intensity of the incident electromagnetic radiation. For example, each photoelectric conversion element SP1, SP2 may include or consist of a photodiode which converts electromagnetic radiation incident on a detection surface into a detector current by means of the photoelectric effect. The electromagnetic radiation may include visible light, infrared radiation and/or ultraviolet radiation. The amplitude of the detector current corresponds to the intensity of the incident electromagnetic radiation, wherein in the intensity range of interest the detector current increases approximately linearly with increasing intensity of the detected electromagnetic radiation.

The first photoelectric conversion element SP1 has a higher sensitivity to light than the second photoelectric conversion element SP2. Typically, the first photoelectric conversion element SP1 is larger than the second photoelectric conversion element SP2. The sensitivity of the first photoelectric conversion element SP1 differs from the sensitivity of the second photoelectric conversion element SP2 by a sensitivity gain.

In addition to the photoelectric conversion elements SP1, SP2, the illustrated configuration example of the pixel circuit 100 includes a floating capacitor FC for storing charge supplied from the second photoelectric conversion element SP2, a floating diffusion region FD for storing charge supplied from the first photoelectric conversion element SP1 and/or the second photoelectric conversion element SP2, a first transfer transistor 101 for the first photoelectric conversion element SP1, a second transfer transistor 106 for the second photoelectric conversion element SP2, a first gate transistor 104 for the floating diffusion region FD, a second gate transistor 105 for the floating capacitor FC, a reset transistor 102, an amplification transistor 103, and a selection transistor 109. Each of the transistors is or includes an FET.

A load path of the first transfer transistor 101 is electrically connected between the cathode of the first photoelectric conversion element SP1 and the floating diffusion region FD. The first transfer transistor 101 serves as transfer element for transferring charge from the first photoelectric conversion element SP1 to the floating diffusion region FD. The floating diffusion region FD serves as temporary local charge storage. A first transfer signal TG1 is supplied to the gate (first transfer gate) of the first transfer transistor 101 through a first transfer control line. The first transfer signal TG1 has an active signal level and an inactive signal level. In response to an active first transfer signal TG1, the first transfer transistor 101 may transfer electrons photoelectrically converted by the first photoelectric conversion element SP1 to the floating diffusion region FD.

A load path of the second transfer transistor 106 is electrically connected between the cathode of the second photoelectric conversion element SP2 and the floating capacitor FC. The second transfer transistor 106 serves as transfer element for transferring charge from the second photoelectric conversion element SP2 to the floating capacitor FC. The floating capacitor FC serves as temporary local charge storage. A second transfer signal TG2 is supplied to the gate (second transfer gate) of the second transfer transistor 102 through a second transfer control line. The second transfer signal TG2 has an active signal level and an inactive signal level. In response to an active second transfer signal TG2, the second transfer transistor 106 may transfer electrons photoelectrically converted by the second photoelectric conversion element SP2 to the floating capacitor FC.

A load path of the reset transistor 102 is electrically connected between a power supply line to which a positive supply voltage VDD is supplied and an auxiliary node AN. A reset signal RST is supplied to the gate of the reset transistor 102 through a reset control line. The reset signal RST has an active signal level and an inactive signal level.

A load path of the first gate transistor 104 is electrically connected between the auxiliary node AN and the floating diffusion region FD. A floating diffusion gate signal FDG is supplied to the gate of the first gate transistor 104 through a floating diffusion control line. The floating diffusion gate signal FDG has an active signal level and an inactive signal level.

A load path of the second gate transistor 105 is electrically connected between the auxiliary node AN, the floating capacitor FC and the second transfer transistor 106. A floating capacitor gate signal FCG is supplied to the gate of the second gate transistor 106 through a floating capacitor control line. The floating capacitor gate signal FCG has an active signal level and an inactive signal level.

The reset transistor 102 serves as a reset element that resets a floating diffusion potential VFD of the floating diffusion region FD and a floating capacitor potential VFC of the floating capacitor.

In particular, an active reset signal RST in combination with an active floating diffusion gate signal FDG sets the floating diffusion potential VFD equal to the positive supply voltage VDD, and an active reset signal RST in combination with an active floating capacitor gate signal FCG sets the floating capacitor potential VFC equal to the positive supply voltage VDD.

The floating diffusion region FD is connected to the gate of the amplification transistor 103 serving as an amplification element. The floating diffusion region FD functions as the input node of the amplification transistor 103.

The amplification transistor 103 and the selection transistor 109 are connected in series between the power supply line for the positive supply voltage VDD and the data signal line VSL. Thus, the amplification transistor 103 is connected to the data signal line VSL through the selection transistor 109. A select signal SEL is supplied to the gate of the selection transistor 109 through a select control line. The select signal SEL has an active signal level and an inactive signal level.

An active select signal SEL turns on the selection transistor 109. When the selection transistor 109 is turned on, the amplification transistor 103 amplifies the floating diffusion potential VFD of the floating diffusion region FD and outputs a voltage corresponding to the floating diffusion potential VFD to the data signal line VSL. The data signal line VSL passes the pixel output signal Vout from the pixel circuit 100 to the column signal processing unit 14. The charge accumulated on the floating capacitor FC may be transferred to the floating diffusion region FD for the read out. In particular, the first and second photoelectric conversion elements SP1, SP2 can be read out successively.

Since the respective gates of the first transfer transistor 101, the second transfer transistor 106, the reset transistor 102, the first gate transistor 104, the second gate transistor 105, and the selection transistor 109 are connected in units of pixel rows, these operations may be simultaneously performed for each of the pixel circuits 100 of one pixel row.

The data signal line VSL is further connected to a constant current circuit 21. The constant current circuit 21 may include a constant current source or a switched capacitor current source supplying at least temporarily a constant current to the data signal line VSL, by way of example.

The amplification transistor 103 of the pixel circuit 100 and the constant current circuit 21 complement to a source follower circuit passing the pixel output signal Vout derived from the floating diffusion potential VFD to the column signal processing unit 14, which includes a ramp signal circuit 200 and a plurality of ADC units 20. The ADC units 20 transform each received pixel output signal Vout into a digital pixel value and pass digital pixel data DPXS including the digital pixel values to the signal processing unit 80.

Thus, the solid-state imaging device 90 includes pixel circuits 100 arranged in pixel columns, wherein, for each pixel column, signal outputs of the pixel circuits 100 are connected to a data signal line VSL. The solid-state imaging device 90 further includes a ramp generator circuit 200 and comparator circuits 23, wherein each comparator circuit 23 generates an active comparator signal in response to a voltage difference between a first comparator input and a second comparator input of the comparator circuit 23, and wherein each first comparator input is connected to one of the data signal lines VSL. The ramp generator circuit 200 includes at least one resistor network 210 and buffer circuits 250. The ramp generator circuit 200 generates at least one voltage ramp signal based on voltages at voltage tap nodes 219 of the at least one resistor network 210. Each buffer circuit 250 buffers a voltage ramp signal and passes a buffered voltage ramp signal to the second comparator input of at least one of the comparator circuits 23.

In particular, the ramp generator circuit 200 may include one single resistor network 219. Alternatively, the ramp generator circuit 200 includes a plurality of resistor networks 219, wherein each resistor network 219 is connected to one or more of the buffer circuits 250.

In addition to a comparator circuit 23, each ADC unit 20 includes a counter circuit 24. The comparator circuit 23 compares the pixel output signal Vout with the voltage ramp signal and outputs an active comparator signal when the voltage ramp exceeds or falls below the pixel output signal Vout. The counter circuit 24 counts events that occur at regular intervals between the start of the voltage ramp and the start of the active comparator signal. The count value at the end of the count period gives the result of the analog-to-digital conversion and defines the digital pixel value for the pixel output signal on the data signal line VSL.

The sensor controller 15 controls the ramp generator circuit 200 and the counter circuit 24. In particular, the sensor controller 15 may synchronize the counting in the counter circuit 24 with the voltage ramp generated in the ramp generator circuit 200.

At least an output portion of the ramp generator circuit 200 may be divided into a plurality of identical second parts, wherein each second part includes at least a buffer circuit 250. The buffered output signal is transmitted to the second comparator input of one comparator circuit 23 or may be transmitted to the second comparator inputs of a group of comparator circuits 23 assigned to the same buffer circuit 250. Buffer circuit 250 and the comparator circuit(s) assigned to the buffer circuit 250 form an output group. The differences among distances between the buffer circuits 250 and the comparator circuits 23 of each output group are comparatively small. As a consequence, the differences between the voltage ramp signals applied to the inputs of the various comparator circuits 23 assigned to different pixel columns are small. The embodiments provide better radiation conversion uniformity in particular for large solid-state imaging devices with a high pixel number.

The ramp generator circuit 200 may include a plurality of identical units, wherein each unit includes at least one of the buffer circuits. In addition to the buffer circuit 250, each unit may include a switch matrix unit, a resistor network and a reference voltage block with one or more reference voltage circuits.

In particular, the ramp generator circuit 200 may include one first part and a plurality of identical second parts, wherein the first part generates at least one internal voltage signal, and wherein each second part generates one of the buffered voltage ramp signals in response to the at least one internal voltage signal.

In particular, the various buffered voltage ramp signals are derivable from the same internal signal or the same internal signals. The first part is formed only once such that chip area can be reduced. In addition to the buffer circuit 250, the second part may include a switch matrix unit, or a switch matrix unit and a resistor network. Accordingly, the first part may include a reference voltage block with one or more reference voltage circuits, or a combination of a resistor network with a reference voltage block with one or more reference voltage circuits.

FIG. 2 shows functional parts of the ramp generator circuit 200 of the solid-state imaging device 90 illustrated in FIG. 1. The ramp generator circuit 200 includes one or more identical resistor networks 210 and one or more identical switch matrix units 220. In addition, the ramp generator circuit 200 may include a reference voltage block 260 that includes one or more reference voltage circuits 230 for each resistor network 210.

According to an embodiment, each of the at least one resistor networks 210 may include resistor elements 211 electrically connected in series between a first supply node VDD and a second supply node VSS, wherein voltage tap nodes 219 are formed between electrically neighboring ones of the resistor elements 211.

In particular, the resistor network 210 may include a number of resistor elements 211 one less, equal to or at least one greater than a number of resolution steps of the analog-to-digital conversion to be performed. For example, for an analog-to-digital conversion encoding digital values with 12 bits, the number of resistor elements 211 may be equal to 4096 or greater. All resistor elements 211 may have the same electrical resistance R.

The first and second supply nodes VDD, VSS may be electrically connected to a voltage source that may supply a temperature compensated regulated constant reference supply voltage between the first and second supply nodes VDD, VSS. Because of the regulated constant reference supply voltage between the first and second supply nodes VDD and VSS and the total number n or resistor elements 211 with electrical resistance R, the current which is flowing through the resistor network 210 is $(VDD{-}VSS)/(n{\times}R)$. Alternatively, the first and second supply nodes VDD, VSS may be electrically connected to a constant current source that may supply a temperature compensated constant reference current through the resistor network 210. Each pair of neighboring resistor elements 211 is connected through one of the voltage tap nodes 219.

In case the ramp generator circuit 200 includes a plurality of resistor networks 210, the resistor networks 210 may have an identical configuration with the same number of resistor elements 211, wherein at least corresponding resistor elements 211 of the various resistor networks 210 or all resistor elements 211 have the same electrical resistance R.

According to an embodiment, the ramp voltage circuit 200 may include switch matrix units 220 with each switch matrix unit 220 including a plurality of electronic switches 221, wherein each electronic switch 221 is operable to connect one of the voltage tap nodes 219 of the at least one resistor network 210 with an input of one of the buffer circuits 250.

Each electronic switch 221 may include an nFET (n channel FET), a pFET (p channel FET) or a transfer gate including FETs of different channel type with the load paths electrically connected in parallel. Each electronic switch 211 is electrically connected between one of the voltage tap nodes 219 of the resistor network 210 and the input (buffer circuit input) of the buffer circuit 250 assigned to the switch matrix unit 220. The number of electronic switches 221 of each switch matrix unit 220 may be equal to the number of resolution steps of the analog-to-digital conversion. For example, for an analog-to-digital conversion that encodes analog values with 12-bit digital values, the number of electronic switches 221 may be equal to $2^{12}$ (4096).

In case the ramp generator circuit 200 includes a plurality of resistor networks 210, each of the resistor networks 210 may be assigned to another switch matrix unit 220. In case the ramp generator circuit 200 includes less resistor networks 210 than switch matrix units 220, each of the switch matrix units 220 may be assigned to a group of resistor networks 210. For example, in case the ramp generator circuit 200 includes one single resistor network 210, each of the switch matrix units 220 may be assigned to that single resistor network 210. The switch matrix units 220 may have an identical configuration with the same number of electronic switches 221, wherein at least corresponding electronic switches 221 of the various switch matrix units 220 or all electronic switches 221 are identical.

In the illustrated configuration, the resistor network 210 is a resistor string and each of the electronic switches 221 is directly connected to one of the voltage tap nodes 219. In particular, a low-resistive ohmic path electrically connects each of the electronic switches 221 with one of the voltage tap nodes 219. An electric resistance of the ohmic path between the electronic switch 221 and the voltage tap node 219 is significantly lower than the electric resistance R of the resistor elements 211. For example, the electric resistance of the ohmic path between the electronic switch 221 and the voltage tap node 219 is at most 10% or at most 1% of the electric resistance R of the resistor elements 211.

At most one single of the electronic switches 221 is in the on-state at each time. The number of voltage tap nodes 219 and electronic switches 221 corresponds to $2^n$, with n representing the number of bits of the digital-to-analog conversion. For example, the number of electronic switches 221 is equal $2^{12}$ for a 12-bit digital-to-analog conversion.

A ramp control circuit 240 successively closes and opens the electronic switches 221 in a predefined order. In particular, the ramp control circuit 240 controls the electronic switches 221 of the switch matrix unit 220 in an order such that the voltage at the buffer circuit input monotonically increases or monotonically decreases. For binary-coded resistor networks 210 as illustrated in FIG. 2, the ramp control circuit 240 may include a shift register and the ramp control circuit 240 closes and opens the electronic switches 221 in such an order that the top voltage tap node 219 electrically closest to the high supply voltage VDD is electrically connected to the buffer circuit input first. The other voltage tap nodes 219 follow in an order given by their electric distance from the top voltage tap node 219 in terms of current flow, with the voltage tap node 219 electrically closest to the top voltage tap node 219 following second and the voltage tap node 219 closest to the low supply voltage VSS following last. According to another example, the electronic switches 221 are switched in such an order that the lowest voltage tap node 219 electrically closest to the low supply voltage VSS is electrically connected to the buffer circuit input first. The other voltage tap nodes 219 follow in an order given by their electric distance from the lowest voltage tap node 219 in terms of current flow, with the voltage tap node 219 electrically closest to the lowest voltage tap node 219 following second and the voltage tap node 219 closest to the high supply voltage VDD following last.

The ramp control circuit 240 closes no more than one of the electronic switches 221 of the switch matrix unit 220 at a time. That is, before an electronic switch 221 is closed, the previously closed electronic switch 221 is opened so that at any given time at most one of the electronic switches 221 is closed. In particular, FIG. 2 shows a state of the switch matrix unit 220 with one single electronic switch 221 closed.

The ramp control circuit 240 may be control the electronic switches 221 at constant switching rate or with different switching rates. In particular, the switching rates may change at slope transition points and may be constant between neighboring slope transition points. The switching rates may be fixed or may be controllable, wherein a switching rate between two neighboring slope transition points may be changed in response to an internal event or in response to a signal supplied from a controller circuit, e.g. the sensor controller 15 of the solid-state imaging device 90 illustrated in FIG. 1.

The buffer circuit 250 buffers the voltage signal output by the switch matrix unit 220 and received at the buffer circuit input. The buffer circuit 250 outputs a voltage ramp signal VRMP and may be effective as impedance converter to decouple circuits receiving the voltage ramp signal VRMP from the resistor network 210 and vice versa. In particular, the buffer circuit 250 decouples voltages at the voltage tap nodes 219 from the impedance of the circuits receiving the voltage ramp signal VRMP. The buffer circuit 250 may also drive the voltage ramp signal VRMP.

Compared to digital-to-analog converters that use a current mirror and control the current using a plurality of switches electrically connected in parallel, the ramp generator circuit 200 shown in FIG. 2 can provide higher driving power. Since the resistor elements 211 can be formed with high accuracy and the manufacturing process for forming the resistor elements 211 is very stable, the voltage ramp has little variation due to manufacturing.

According to a non-illustrated example, a ramp generator circuit 200 with the resistor network 210, the switch matrix unit 220 and the buffer circuit 250 (and without voltage reference circuits 230) controls the electronic switches 211 in a way that the buffer circuit input is successively connected to voltage tap nodes 219 with increasing or decreasing electric distance to the positive power supply voltage VSS. A voltage signal with stepped, monotonically rising or falling voltage amplitude is passed to the buffer circuit input. The rate at which the buffer circuit input voltage rises or falls is given by the clock rate at which the ramp control circuit 240 addresses the electric switches 211. In case of a constant clock rate, the rate at which the buffer circuit 250 input voltage rises or falls is constant.

FIG. 2 refers to an alternative embodiment with a ramp generator unit 200 that includes a reference voltage circuit 230 supplies a reference voltage to a voltage tap node 219 of at least one of the resistor networks 210.

In case the ramp generator unit 200 includes one single resistor network 210, a reference voltage block 260 may include one reference voltage circuit 230 connected to one of the voltage tap nodes 219 or may include a plurality of reference voltage circuits 230, each connected to another one of the voltage tap nodes 219 of the resistor network 210. In case the ramp generator unit 200 includes a plurality of resistor networks 210, a single reference voltage block 260 may include one reference voltage circuit 230 connected to the same voltage tap node 219 in each of the resistor networks 210 or may include a plurality of reference voltage circuits 230, each connected to the same voltage tap node 219 in each resistor network 210. In case the ramp generator unit 200 includes a plurality of resistor networks 210 and a reference voltage block 260 for each resistor network 210, each reference voltage circuit 230 may be connected to the same voltage tap node 219 in each of the resistor networks 210.

According to an embodiment, the ramp generator circuit 200 may include at least two reference voltage circuits 230, wherein the at least two reference voltage circuits 230 are electrically connected to different voltage tap nodes 219 of at least one of the resistor networks 210.

In the illustrated embodiment the voltage reference block 260 includes three voltage reference circuits 230. The outputs of the reference voltage circuit 230 are electrically connected to different ones of the voltage tap nodes 219. Each reference voltage circuit 230 supplies a reference voltage to the voltage tap node 219 it is connected to. Each reference voltage deviates from the voltage that would be reached at the voltage tap node 219 in the absence of the reference voltage circuit 230 by virtue of the voltage divider formed by the resistor elements 211 connected in series between the concerned voltage tap node 219 and the second supply node VSS. Each reference voltage may be higher or lower than the voltage that would be reached at the same voltage tap node 219 in the absence of the reference voltage circuit 230. Each reference voltage defines a slope transition point at which the slope of a voltage ramp changes between the two adjoining voltage ramp sections. Each reference voltage circuit 230 connected to a voltage tap node 219 increases by one the number of voltage ramp sections with different slope angles.

Figure 3:
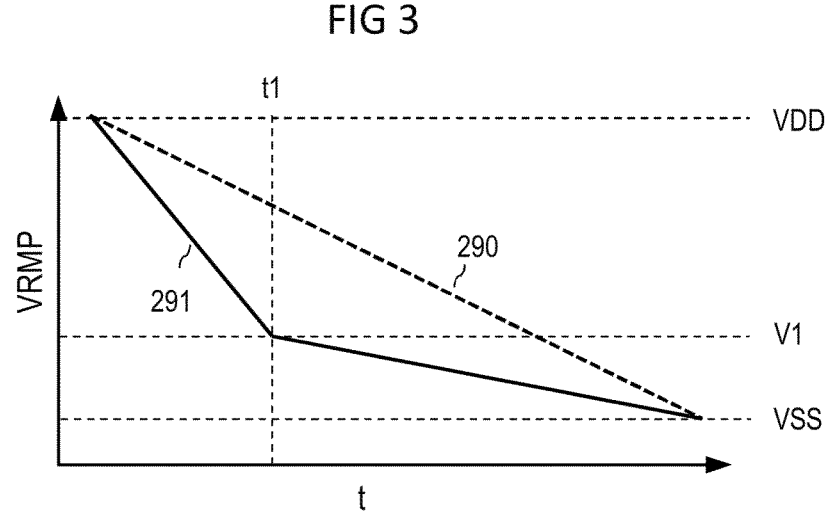
FIG. 3 is a schematic diagram that illustrates the effect of a reference voltage circuit on the voltage ramp signal output by the ramp generator circuit of FIG. 2.

FIG. 3 shows a one-part voltage ramp 290 having a first slope angle. The one-part voltage ramp 290 may be generated by a ramp generator circuit without reference voltage circuits 230. A ramp generator circuit that includes one single reference voltage circuit 230 of the type shown in FIG. 2 outputs a two-part voltage ramp 291 having a first section and a second section. One of the first and second sections has a slope angle that is greater than the first slope angle, and the other one of the first and second sections has a slope angle that is less than the first slope angle. The smaller the slope angle is, the smaller the relative sensitivity change is. A slope transition point between the first and second sections is given by the point in time when the voltage ramp assumes the voltage value of the reference voltage V1 output by the reference voltage circuit 230.

In addition, the switching rate of the electronic switches 221 of the switch matrix unit 220 illustrated in FIG. 2 may change at the slope transition points and may be constant between neighboring slope transition points. The switching rates may be fixed or may be controllable, wherein a switching rate between two neighboring slope transition points may be changed in response to an internal event or in response to a signal supplied from a controller circuit, e.g. the sensor controller 15 of the solid-state imaging device of FIG. 1.

Figure 4:
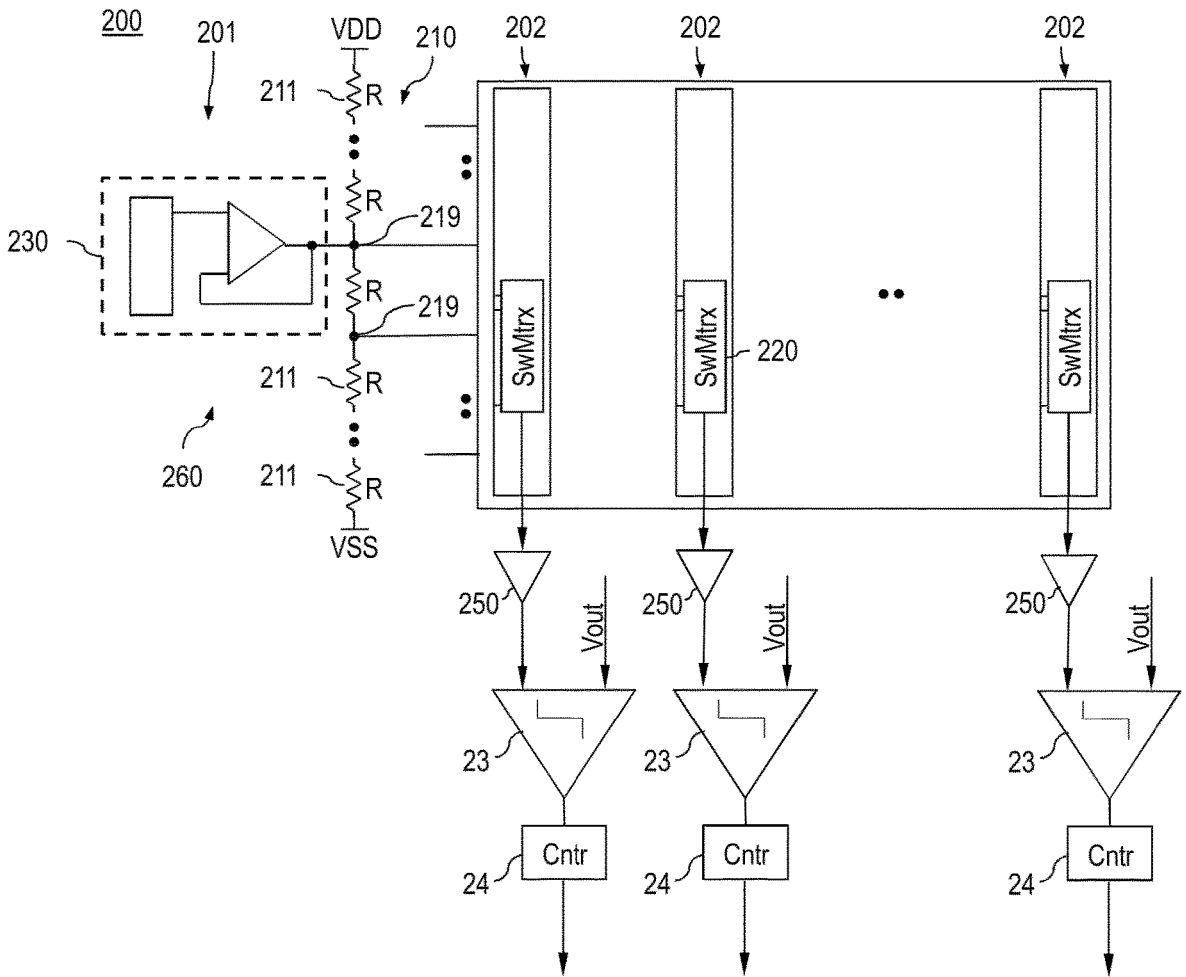
FIG. 4 is a simplified block diagram illustrating a ramp generator circuit in a configuration with one single resistor network according to an embodiment.
Figure 5:
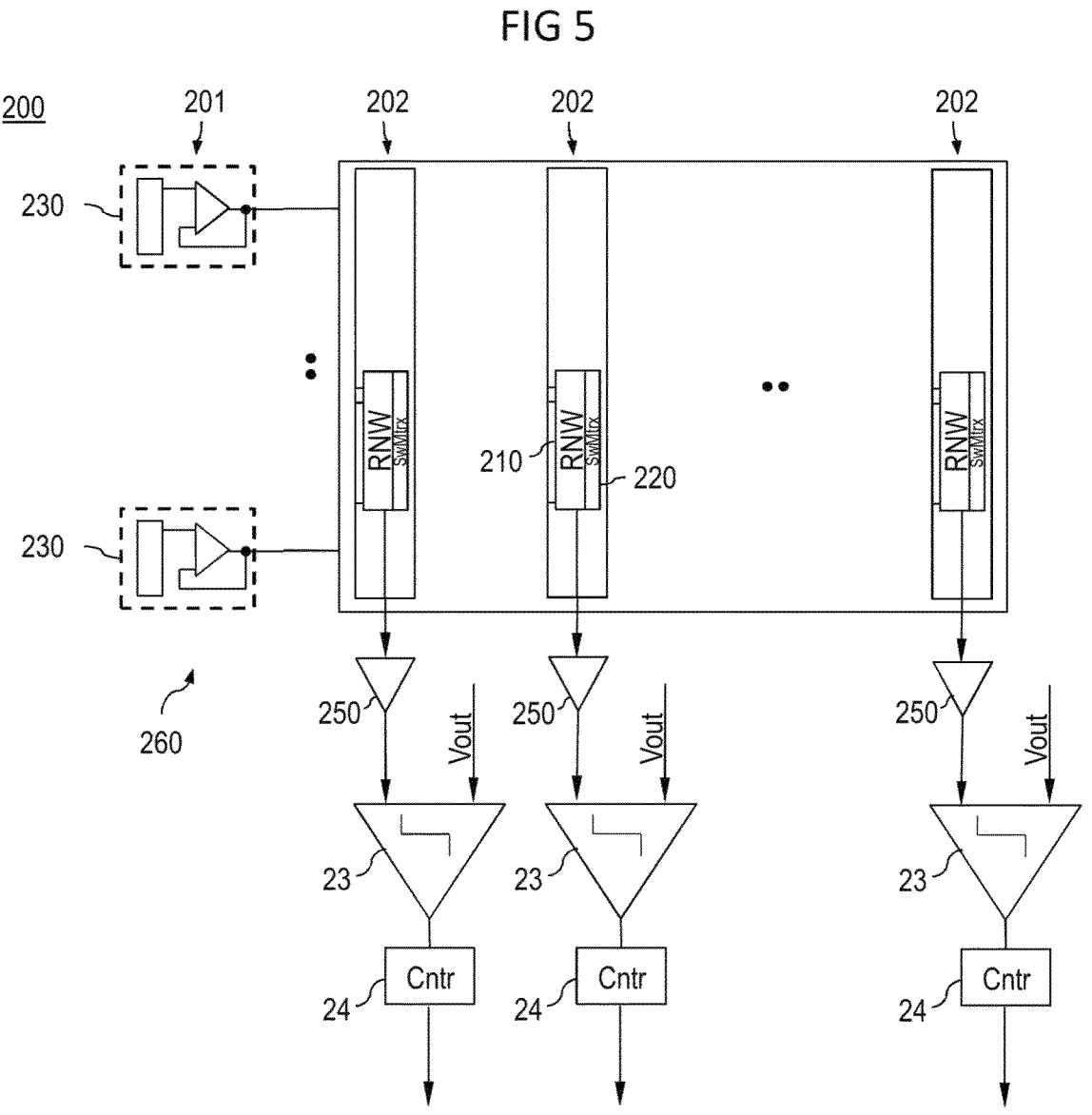
FIG. 5 is a simplified block diagram illustrating a ramp generator circuit in a configuration with a plurality of resistor networks and one voltage reference block according to another embodiment.

FIG. 4 and FIG. 5 show ramp generator circuits 200 that include one first part 201 and a plurality of identical second parts 202, wherein the first part 201 generates at least one internal voltage signal, and wherein each second part 202 generates one of the buffered voltage ramp signals in response to the at least one internal voltage signal.

In particular, the various buffered voltage ramp signals are derivable from the same internal signal or the same internal signals. The first part 201 is formed only once such that chip area can be reduced. In addition to the buffer circuit 250, the second part 202 may include a switch matrix unit 220, or a switch matrix unit 220 and a resistor network 210. Accordingly, the first part 201 may include a reference voltage block 260 with one or more reference circuits 230 each, or a reference voltage block 260 and a resistor network 210.

According to the embodiment shown in FIG. 4, the solid-state imaging device includes a ramp generator circuit 200 that includes one resistor network 210, wherein the ramp generator circuit 200 switches the voltage tap nodes 219 of the resistor network 210 to the input of each buffer circuit 250.

The first part 201 includes one voltage reference block 260 and one resistor network 210. Each second part 202 may include a switch matrix unit 220 and a buffer circuit 250, wherein the switch matrix unit 220 successively passes the voltages taped from the voltage tap nodes 219 of the resistor network 210 to the input of the buffer circuit 250. The switch matrix unit 220 may be formed in close vicinity of the buffer circuit 250. For all second parts 202, the distance between the switch matrix unit 220 and the buffer circuit 250 may be approximately the same. All second parts 202 may have approximately the same layout.

Further according to the embodiment shown in FIG. 4, the solid-state imaging device includes a reference voltage circuit 230 that supplies a reference voltage to a voltage tap node 219 of the resistor network 210.

In particular, the ramp generator circuit 200 may include a reference voltage block 260 with one single reference voltage circuit 230, wherein the output of the reference voltage circuit 230 is connected to one of the voltage tap nodes 219 or alternatingly (selectively) connectable to a plurality of voltage tap nodes 219. Alternatively, the ramp generator circuit 200 may include a reference voltage block 260 with more than one reference voltage circuit 230, wherein the outputs of the reference voltage circuits 230 are connected to different ones of the voltage tap nodes 219.

In another example, the ramp voltage circuit 200 of FIG. 4 may be formed without any reference voltage circuit 230 connected to any of the voltage tap nodes 219.

According to the embodiment shown in FIG. 5 the ramp generator circuit 200 includes a plurality of resistor networks 210, wherein the ramp generator circuit 200 switches the voltage tap nodes 219 of one of the resistor networks 210 to the input of one of the buffer circuits 250.

The first part 201 includes one voltage reference block 260 with one or more voltage reference circuits 230. Each second part 202 includes a resistor network 210, a switch matrix unit 220 and a buffer circuit 250, wherein the switch matrix unit 220 successively passes the voltages taped from the voltage tap nodes 219 of the resistor network 210 to the input of the buffer circuit 250. The resistor network 210 and the switch matrix unit 220 may be formed in close vicinity of the buffer circuit 250. For all second parts 202, the distances between the resistor network 210, the switch matrix unit 220 and the buffer circuit 250 may be approximately the same. All second parts 202 may have approximately the same layout.

Further according to the embodiment shown in FIG. 5, the solid-state imaging device includes a reference voltage circuit 230 that supplies a reference voltage to a voltage tap node 219 of each of the resistor networks 210.

In particular, the ramp generator circuit 200 may include a reference voltage block 260 with one single reference voltage circuit 230, wherein the output of the reference voltage circuit 230 is connected to one of the voltage tap nodes 219 or alternatingly (selectively) connectable to a plurality of voltage tap nodes 219. Alternatively, the ramp generator circuit 200 may include a reference voltage block 260 with more than one reference voltage circuit 230, wherein the outputs of the reference voltage circuits 230 are connected to different ones of the voltage tap nodes 219.

In another example, the ramp voltage circuit 200 of FIG. 5 may be formed without any reference voltage circuit 230 connected to any of the voltage tap nodes 219.

Figure 6:
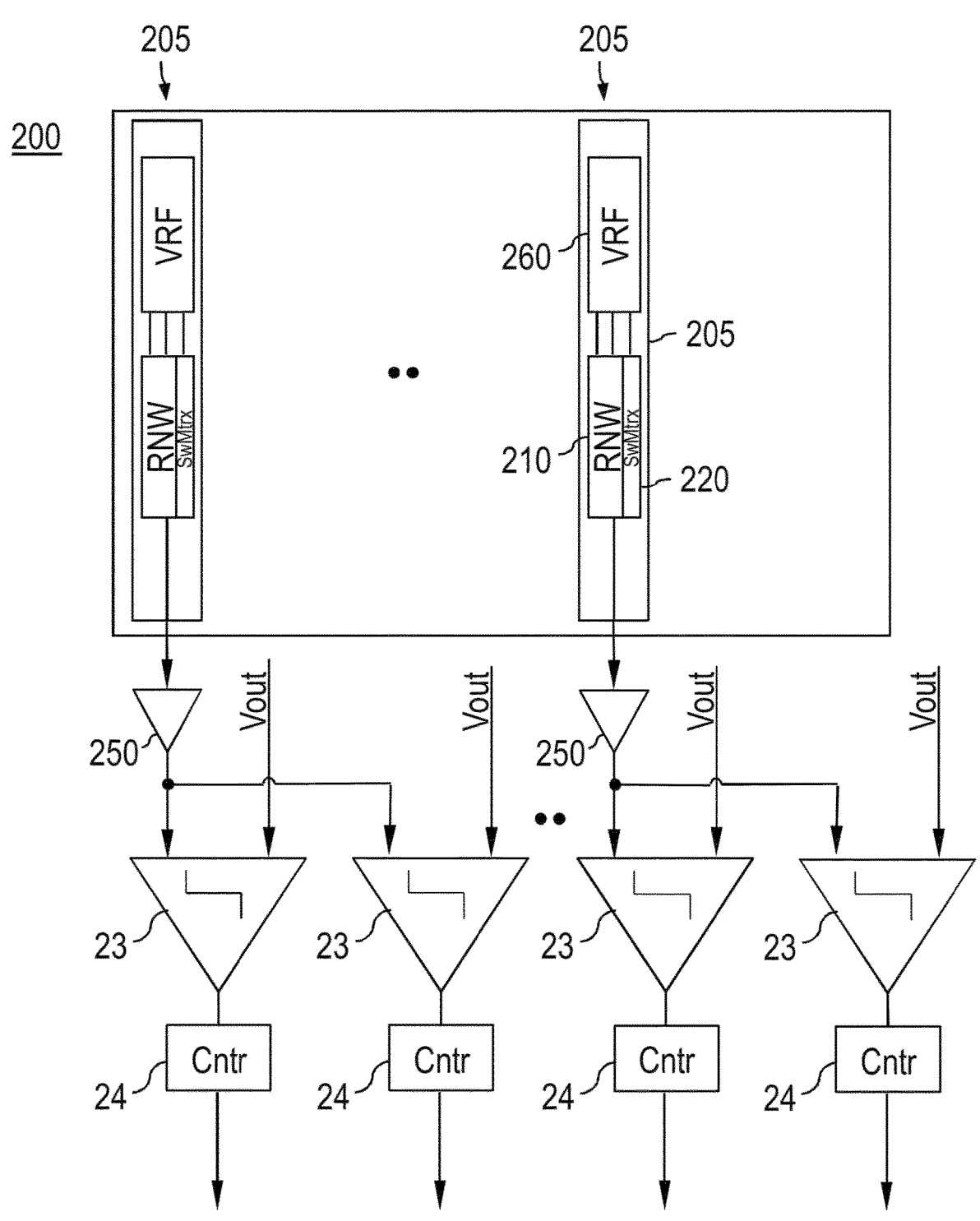
FIG. 6 is a simplified block diagram illustrating a ramp generator circuit in a configuration with one buffer circuit connected to more than one comparator circuit according to another embodiment.
Figure 7:
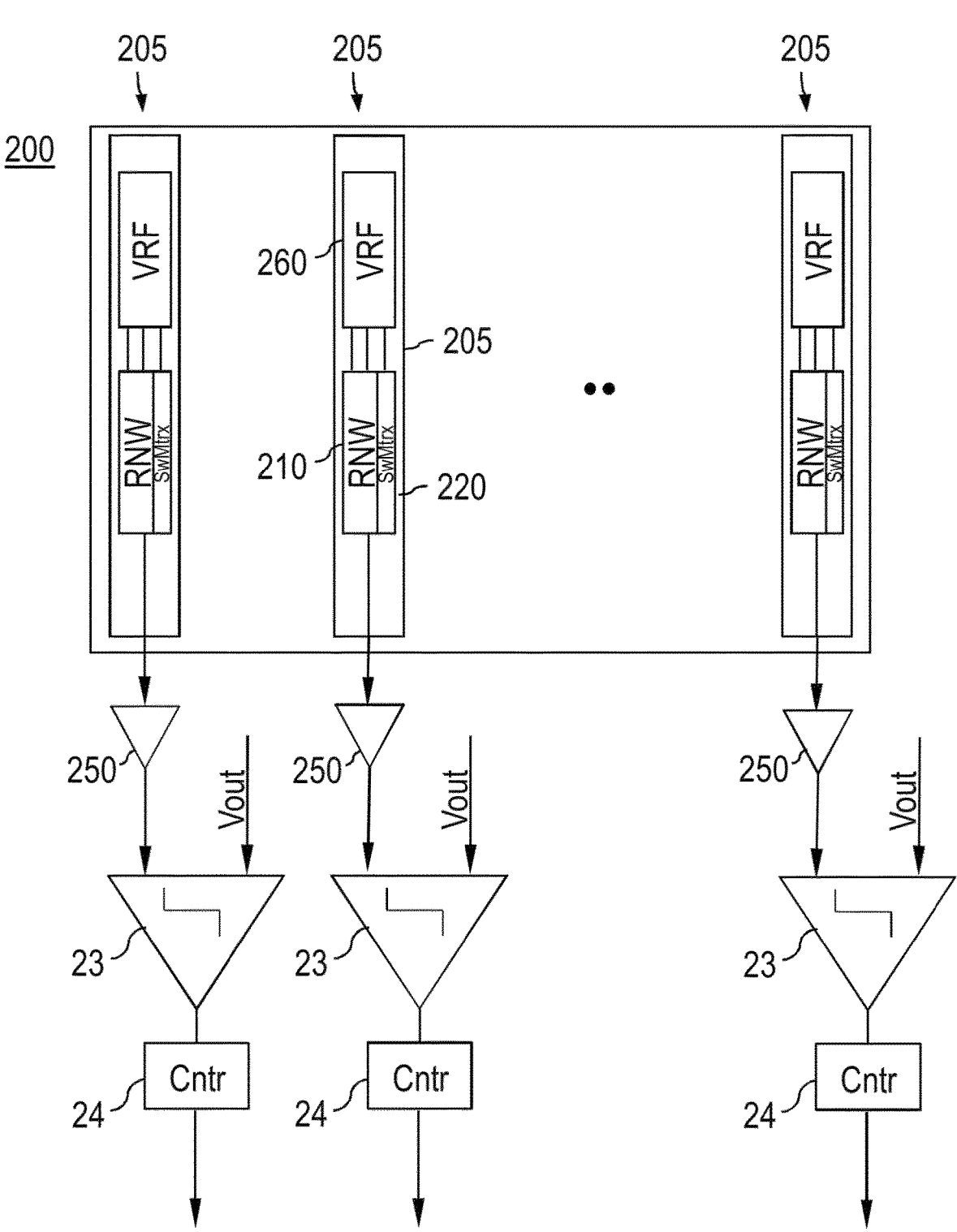
FIG. 7 is a simplified block diagram illustrating a ramp generator circuit in a configuration with each buffer circuit connected to one comparator circuit according to another embodiment.

FIG. 6 and FIG. 7 refer to further ramp generator circuits 200 that include a plurality of resistor networks 210, wherein the ramp generator circuit 200 switches the voltage tap nodes of one of the resistor networks 210 to the input of one of the buffer circuits 250.

According to an embodiment, the ramp generator circuit 200 includes a plurality of reference voltage circuits, wherein each reference voltage circuit supplies a reference voltage to a voltage tap node of one of the resistor networks 210.

One voltage reference block 260 with one or more voltage reference circuits, one resistor network 210, one switch matrix unit 220 and one buffer circuit 250 may form a building block 205. The voltage reference block 260, the resistor network 210 and the switch matrix unit 220 of the same building block 205 may be formed in close vicinity of the buffer circuit 250. For all building blocks 205, the distances between the resistor network 210, the switch matrix unit 220 and the buffer circuit 250 may be approximately the same. All building blocks 205 may have approximately the same layout.

According to an embodiment illustrated in FIG. 6, each buffer circuit 250 may pass the buffered voltage ramp signal to the second comparator inputs of two or more of the comparator circuits 23. The comparator circuits 23 receiving the same buffered voltage ramp signal may be in close vicinity to each other. Two or more pixel columns may share the same building block and the total chip area of the ramp generator circuit 200 can be reduced.

According to an embodiment illustrated in FIG. 7, each buffer circuit 250 passes the buffered voltage ramp signal to the second comparator input of one of the comparator circuits 23.

Figure 8A:
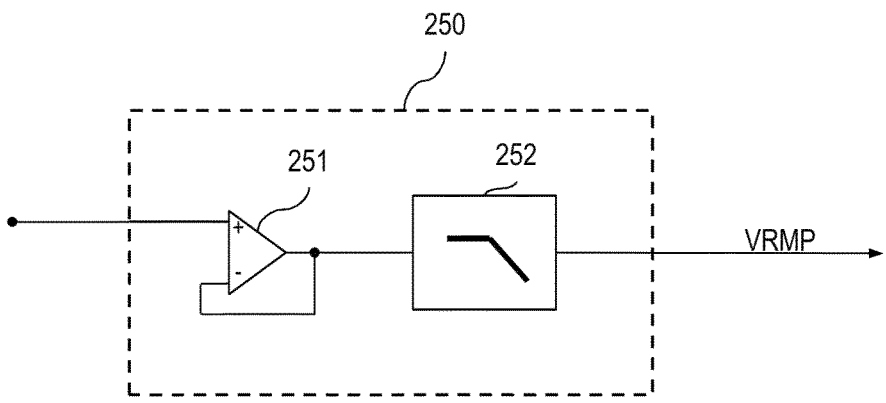
FIG. 8A is a simplified circuit diagram of a buffer circuit with a low pass filter according to an embodiment.

FIG. 8A shows a buffer circuit 250 including an OpAmp 251 with its non-inverting input electrically connected to the buffer circuit input. The OpAmp 251 is in a unity gain configuration. A low-pass filter circuit 252 receives the output signal from the OpAmp 251 and outputs a smoothed voltage ramp signal VRMP. Alternatively or in addition, the buffer circuit 250 may include a narrow-bandwidth buffer or may be configured as narrow-bandwidth buffer. The narrow bandwidth buffer may perform a low-pass filter operation to reduce the voltage steps.

Figure 8B:
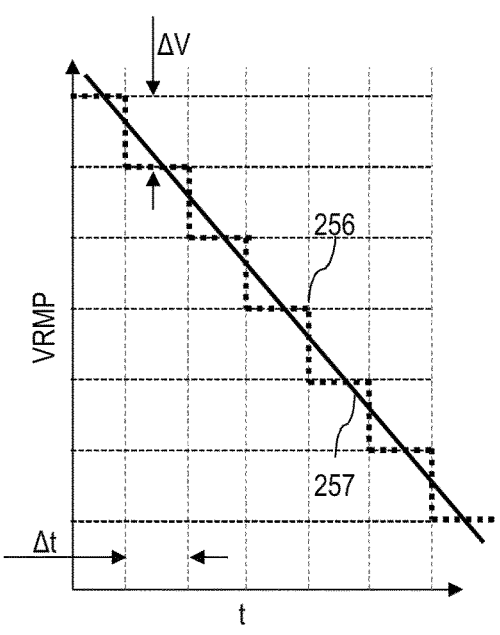
FIG. 8B is a simplified time diagram illustrating the effect of the low pass filter of FIG. 8A on a voltage ramp signal.

In FIG. 8B reference sign 256 denotes the stepped voltage at the buffer circuit input. Reference sign 257 denotes the smoothed voltage ramp signal at the output of the low-pass filter circuit 252 of FIG. 8A.

Figure 9A:
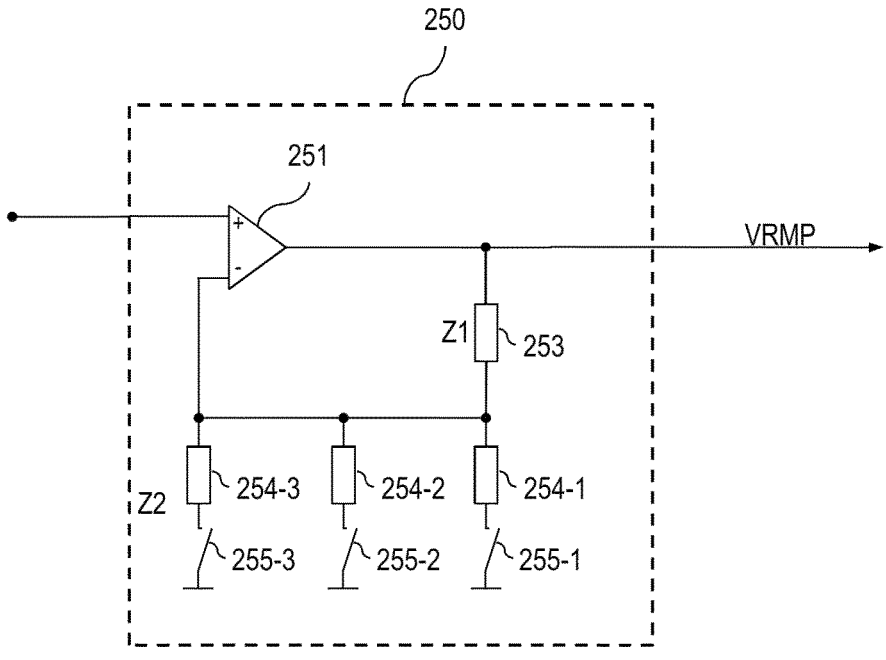
FIG. 9A is a simplified circuit diagram of a buffer circuit with a programmable gain amplifier according to another embodiment.

FIG. 9A shows an buffer circuit 250 that includes a programmable gain amplifier. The programmable gain amplifier may be of the inverting type or of the non-inverting type.

In the illustrated example, the programmable gain amplifier is of the non-inverting type. In particular, the programmable gain amplifier includes an OpAmp 251, wherein the non-inverting OpAmp input is electrically connected with the buffer circuit input. A feedback impedance network includes a first impedance Z1 between the OpAmp output and the inverting OpAmp input and a second impedance Z2 between the inverting OpAmp input and a negative reference potential.

According to another example, the programmable gain amplifier is of the inverting type, wherein the non-inverting OpAmp input is electrically connected to a reference potential. A feedback impedance network includes a first impedance Z1 between the OpAmp output and the inverting OpAmp input and a second impedance Z2 between the inverting OpAmp input and the buffer circuit input.

At least one of the first impedance Z1 and the second impedance Z2 may be programmable, i.e. reconfigurable during operation of the ramp generator circuit.

According to the example shown in FIG. 9A, the first impedance Z1 includes a first impedance element 253. The reconfigurable second impedance Z2 includes two or more branches electrically connected in parallel, wherein each branch includes a serial connection of an impedance switch 255-1, 255-2, 255-3 and a second impedance element 254-1, 254-2, 254-3. The gain of the programmable gain amplifier changes depending on the state (on or off) of the impedance switches 255-1, 255-2, 255-3.

A control circuit, e.g. the sensor controller 15 of the solid-state imaging device 90 as shown in FIG. 1 may control the impedance switches 255-1, 255-2, 255-3 in response to an instruction received from outside the solid-state imaging device 90, e.g. a changed user setting and/or in response to internal signals of the solid-state imaging device 90, e.g. in response to information contained in the pixel output signals.

Figure 9B:
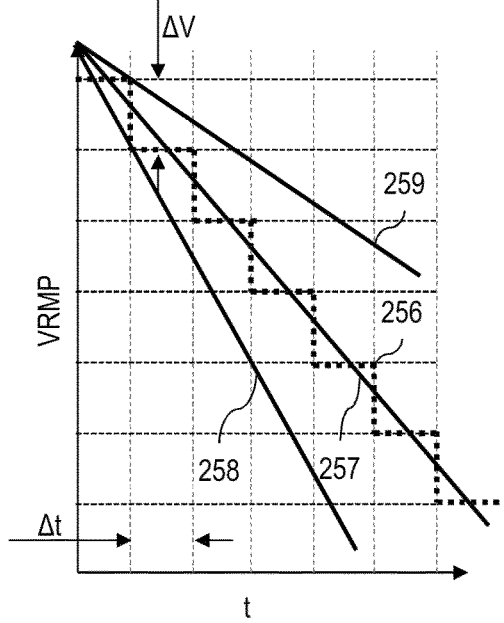
FIG. 9B is a simplified time diagram illustrating the effect of the programmable gain amplifier of FIG. 9A on a voltage ramp.

In FIG. 9B reference sign 256 denotes the stepped voltage at the buffer circuit input. Reference signs 257, 258, 259 denote the smoothed voltage ramp signals at the output of the buffer circuit 250 of FIG. 9A for three different settings of the impedance switches 255-1, 255-2, 255-3. The state of the impedance switches 255-1, 255-2, 255-3 influences the slope of the voltage ramp signal VRMP.

Figures 10, 11:
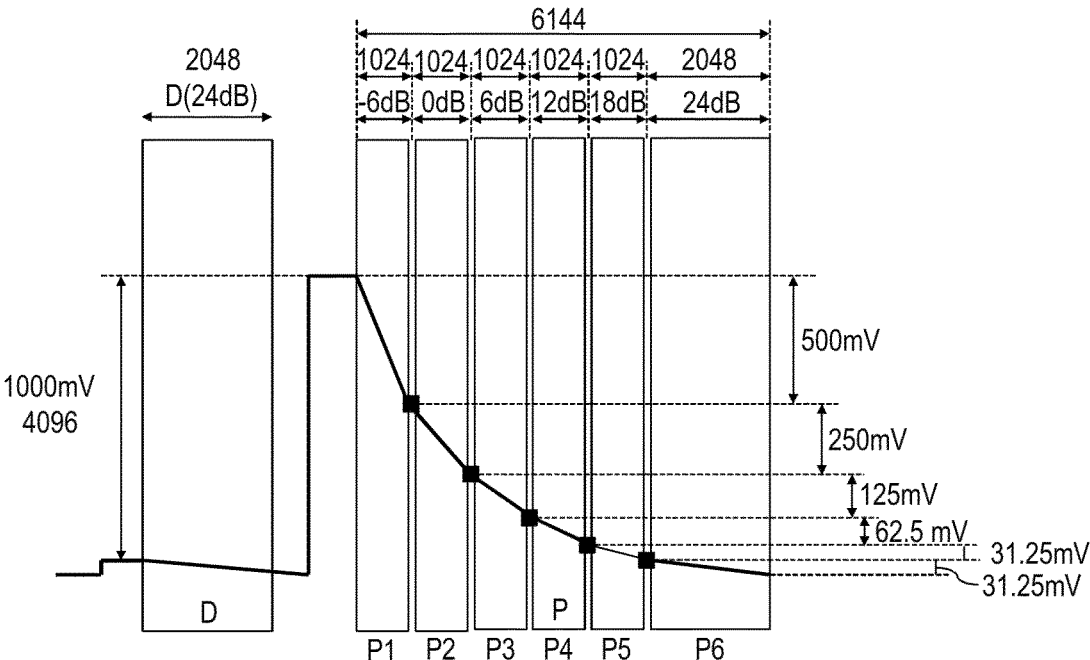
FIG. 10 and FIG. 11 include schematic time charts for discussing effects of the embodiments during a reset phase and a data phase of a pixel readout cycle in a solid-state imaging device.

FIG. 10 and FIG. 11 illustrate the effect of a ramp generator circuit 200 as described above on the analog-to-digital conversion of pixel output signals of high dynamic range pixel circuits with intensity read-out.

In a solid-state imaging device 90 as illustrated in FIG. 1, a readout of one pixel circuit includes two periods: In a first period, a first pixel output signal (data signal) is read out directly after illumination of the pixel and converted into a digital pixel value (pixel data value) by AD (analog-to-digital) conversion. In a second period, a second pixel output signal (noise signal) of the non-illuminated pixel is read out and converted into a digital pixel value (pixel noise value). The second period may directly precede or may directly follow the first period. The final pixel output value is obtained by subtracting the pixel noise value from the pixel data value, wherein noise effects on the final pixel output value can be reduced.

The noise signal corresponds to the voltage of the floating diffusion immediately after an active reset signal turns on the reset transistor and connects the floating diffusion FD to the positive power supply voltage VDD.

For the AD conversion of the noise signal, the comparator of the AD converter compares the voltage ramp signal with the noise signal in a P (preset) phase. For the AD conversion of the data signal, the comparator compares the voltage ramp signal with the data signal in a D (data) phase.

According to a CDS (correlated double sampling) readout method of a high dynamic range pixel, the P phase precedes the D phase. In a DDS (double data sampling) readout method, the D phase precedes the P phase. For example, the CDS readout may be applied to the first photoelectric conversion element SP1, which has higher sensitivity, and the DDS readout may be applied to the second photoelectric conversion element SP2, which has lower sensitivity.

FIG. 10 shows linear (one-part) voltage ramps used as reference signals for the comparator in the D phase and the P phase of a comparative AD converter in a DDS readout. In the D phase and in the P phase, the voltage of the reference signal decreases linearly with the same, constant slope. While the linear voltage ramp provides constant absolute intensity resolution across the covered intensity range, the relative intensity resolution ("constant resolution", ConRes) degrades towards lower voltage values of the voltage ramp.

If the DDS readout is applied to the lower sensitive second photoelectric conversion element SP2, for small values at the right hand side of the voltage ramp, the relative intensity resolution is lowest.

FIG. 11 shows a voltage ramp provided by a ramp generator circuit 200 that includes five reference voltage circuits 230, similar to the ramp generator circuit 200 of FIG. 2. Each of the reference voltage circuits 230 supplies a reference voltage to one of the voltage tap nodes 219 of the resistor network 210 of the ramp generator circuit 200, such that at each voltage tap node 219 connected to the output of one of the reference voltage circuits 230, the voltage is lower than it would be without the reference voltage circuits 230 solely due to the resistor network 210.

The voltage ramp includes six sections with different slope angles, wherein the slope angle strictly monotonically decreases with time. The decreasing slope angle provides a non-constant absolute resolution but decreases the relative intensity resolution for smaller voltage values of the voltage ramp, as it is required for many applications of solid-state imaging devices with wide dynamic range, in particular in the field of computer vision, e.g. surveillance cameras and automotive cameras.

Figure 12:
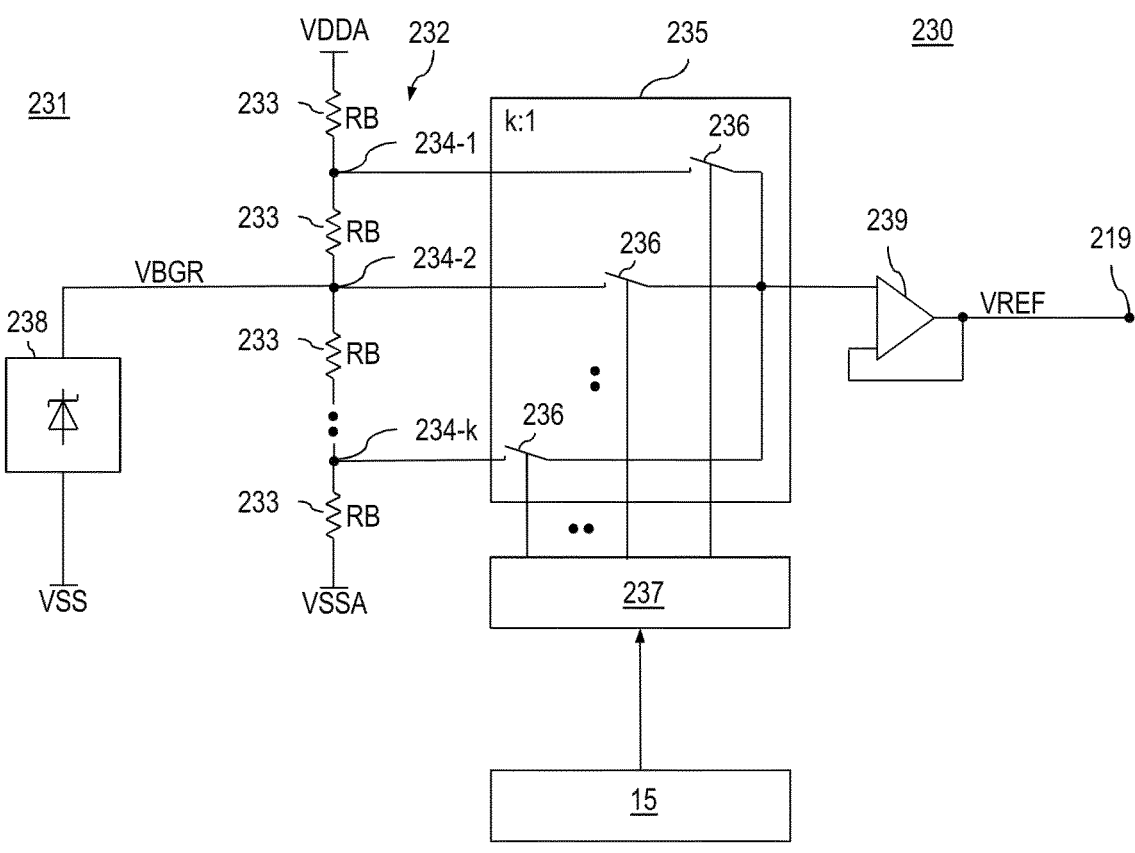
FIG. 12 is a simplified circuit diagram showing a programmable reference voltage circuit including a resistor string according to an embodiment.

FIG. 12 refers to an embodiment with the at least one reference voltage circuit 230 including a voltage generation circuit 231 adapted to generate a reference voltage and an auxiliary buffer circuit 239 adapted to buffer the generated reference. The voltage generation circuit 231 supplies an input voltage to the auxiliary buffer circuit 239. The auxiliary buffer circuit 239 may decouple the voltage generation circuit 231 from the resistor network 210.

The voltage generation circuit 231 includes a resistor string 232 that includes resistance elements 233 electrically connected in series between a first auxiliary supply node VDDA and a second auxiliary supply node VSSA, wherein reference circuit nodes 234 are formed between electrically neighboring resistance elements 233. The voltage generation circuit 231 further includes reference voltage switches 236, wherein each reference voltage switch 236 is operable to connect one of the reference circuit nodes 234 with an input of the auxiliary buffer circuit 239.

The resistance elements 233 may have different electrical resistance values. For example, the electrical resistance values of the resistance elements 233 may be integer multiples of a unit resistance to provide a target reference voltage at the respective reference circuit nodes 234-1, 234-2. Alternatively, all resistance elements 233 may have the same electrical resistance value RB. The number of resistance elements 233 in the resistor string 232 can be significantly smaller than the number n of resistor elements 211 in the resistor network 210 of FIG. 2.

The first and second auxiliary supply nodes VDDA, VSSA may be electrically connected to a voltage source that may supply a temperature compensated regulated constant reference supply voltage between the first and second auxiliary supply nodes VDDA, VSSA. Alternatively, the first auxiliary supply node VDDA may be electrically connected with the first supply node VDD and the second auxiliary supply node VSSA may be electrically connected with the second supply node VSS. Alternatively, the first and second auxiliary supply nodes VDDA, VSSA may be electrically connected to a constant current source that may supply a temperature compensated constant reference current through the resistor string 232. Each pair of neighboring resistance elements 233 is connected through a reference circuit node 234.

Each reference voltage switch 236 may include an nFET, a pFET or a transfer gate including FETs of different channel type with the load paths electrically connected in parallel. Each reference voltage switch 236 is electrically connected between one of the reference circuit nodes 234 and the input of the auxiliary buffer circuit 239. The reference voltage switches 236 form a reference voltage switch arrangement 235. The number k of reference voltage switches 236 in the reference voltage switch arrangement 235 is significantly smaller than the number n of resistor elements 211 in the resistor network 210 of FIG. 2, because the programmable reference voltage circuit 230 generates only a coarse voltage and a small number of switches suffices. For example, the number k may be equal to or smaller than 10.

The reference voltage generation circuit 231 may further include a voltage reference control circuit 237 that controls the reference voltage switches 236 of the reference voltage switch arrangement 235, wherein the voltage reference control circuit 237 closes no more than one of the electronic switches 236 of the reference voltage switch arrangement 235 at a time.

That is, before any of the reference voltage switches 236 is closed, each previously closed reference voltage switch 236 is opened so that at any given time at most one of the reference voltage switches 236 is closed.

A control circuit, e.g. the sensor controller 15 of a solid-state imaging device 90 as shown in FIG. 1 may control the voltage reference control circuit 237 in response to an instruction received from outside the solid-state imaging device 90, e.g. in response to a changed user setting and/or in response to internal signals of the solid-state imaging device 90, e.g. in response to information contained in the pixel output signals.

The reference voltage circuit 230 may include a bandgap reference circuit 238 that supplies an auxiliary reference voltage VBGR to one of the reference circuit nodes 234.

In particular, the bandgap reference circuit 238 may be electrically connected to one of the reference circuit nodes 234. The bandgap reference circuit 238 generates and drives a constant voltage regardless of power supply variations, temperature changes, or circuit loading. The bandgap reference circuit 238 may include a bandgap voltage diode with or without output buffer or a Brokaw bandgap reference circuit, by way of example. The auxiliary reference voltage VBGR may be around 1.25 V.

In particular, the different reference voltage circuits 230 of the ramp generator circuit 200 of FIG. 2 may have the same underlying configuration with bandgap reference circuit 238, resistor string 232, reference voltage switch arrangement 235, and voltage reference control circuit 237. The reference voltage circuits 230 of the ramp generator circuit 200 of FIG. 2 may differ as regards the reference circuit node 234-1, 234-2, . . . , 234-k to which the bandgap reference circuit 238 is electrically connected and/or as regards the resistance values RB of the resistance elements 233.

The controllable voltage range of the reference voltage circuit 230 depends on which of the reference circuit nodes 234-1, 234-2, . . . , 234-k the bandgap reference circuit 238 is connected to.

Figure 13:
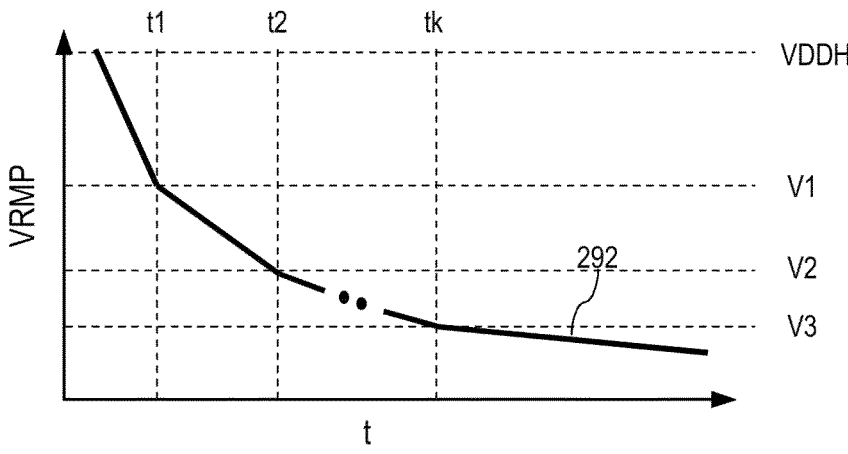
FIG. 13 and FIG. 14 include schematic time charts for discussing effects of the programmable reference voltage circuit of FIG. 12.

FIG. 13 shows three slope transitions points of a multipart voltage ramp 292 at t=t1, t=t2, and t=tk. In the topmost reference voltage circuit 230 supplying the highest reference voltage to the resistor network 210 of the ramp generator circuit 200, the bandgap reference circuit 238 of FIG. 12 may be connected with the topmost reference circuit node 234-1 electrically closest to the first auxiliary supply node VDDA or with the second topmost reference circuit node 234-2 as illustrated. The voltage reference control circuit 237 controls the reference voltage switches 236 such that only the second reference circuit node 234-2 is closed. The resulting first reference voltage V1 is supplied to the resistor network voltage tap node 219 to which the topmost reference voltage circuit 230 is connected. At t=t1 the ramp control circuit 240 connects that voltage tap node 219 to which the topmost reference voltage circuit 230 is connected with the input of the buffer circuit 250 of FIG. 2.

In response to an internal or external event, the voltage reference control circuit 237 of FIG. 12 may control the reference voltage switches 236 such that only the first reference circuit node 234-1 is closed. The reference voltage circuit 230 supplies a raised first reference voltage V1↑ to the resistor network voltage tap node 219 to which the topmost reference voltage circuit 230 is connected. The voltage ramp signal 290 is raised on both sides of the first slope transition point at t=t1 as indicated by reference sign 293 in FIG. 14.

In response to another internal or external event, the voltage reference control circuit 237 may control the reference voltage switches 236 such that only the k-th reference circuit node 234-k is closed. The reference voltage circuit 230 supplies a lowered first reference voltage V1↓ to the resistor network voltage tap node 219 to which the topmost reference voltage circuit 230 is connected. The voltage ramp signal 290 is lowered on both sides of the first slope transition point at t=t1 as indicated by reference sign 294 in FIG. 14.

Figure 15:
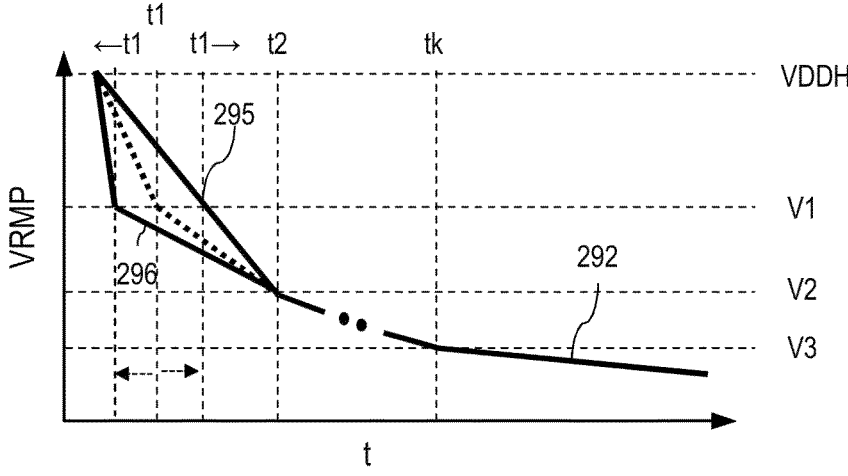
FIG. 15 and FIG. 16 include schematic time charts for discussing effects of a ramp control circuit employing different switching rates.

In FIG. 15 the position of the first slope transition point of a multi-part voltage ramp 292 is adjusted by the rate at which the electronic switches in the switch matrix unit 220 switch.

For the voltage ramp 295 the switching rate between the start of the voltage ramp and the first slope transition point is lower than for the voltage ramp 292. The slope of the voltage ramp 295 is less steep and the voltage ramp 295 reaches the first reference voltage V1 at t=t1→after t1. In the illustrated embodiment, the switching rate between the first slope transition point and the second slope transition point is higher than for the voltage ramp 292. Since the slope of the voltage ramp 296 is steeper, the voltage ramp 296 can reach the second reference voltage V2 at the same time t=t2 as the voltage ramp 292. Basically, the switching rate between other slope transition points remains unaffected from a change of the switching rate between two slope transition points.

For the voltage ramp 296 the switching rate between the start of the voltage ramp and the first slope transition point is higher than for the voltage ramp 292. The slope of the voltage ramp 296 is steeper and the voltage ramp 296 reaches the first reference voltage V1 at t=←t1 prior to t1. In the illustrated embodiment, the switching rate between the first slope transition point and the second slope transition point is lower than for the voltage ramp 292. Since the slope of the voltage ramp 296 is less steep between the first slope transition point and the second slope transition point, the voltage ramp 296 can reach the second reference voltage V2 at the same time t=t2 as the voltage ramp 292. Basically, the switching rate between the other slope transition points is not necessarily affected by the change of the switching rate between two slope transition points.

Figure 14:
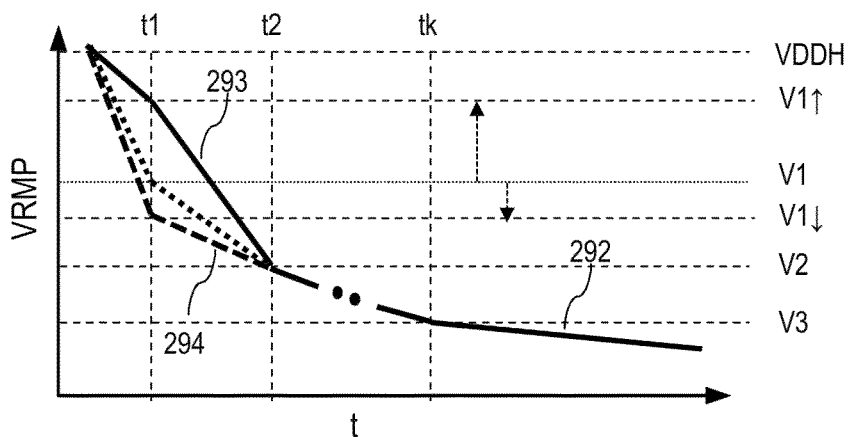
Figure 16:
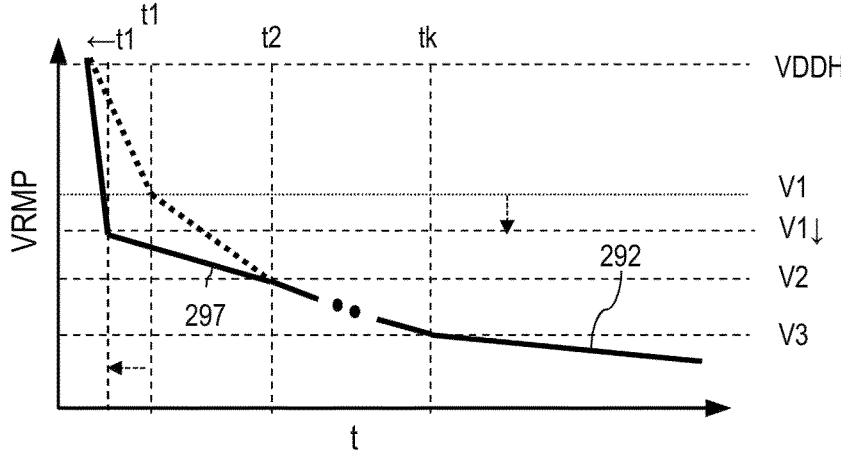

FIG. 16 shows an example of a voltage ramp 297 obtained by a combination of lowering the first reference voltage V1 as described for voltage ramp 294 in FIG. 14 and increasing the switching rate between the start of the voltage ramp and the first slope transition point as described for voltage ramp 296 in FIG. 15.

Figure 17:
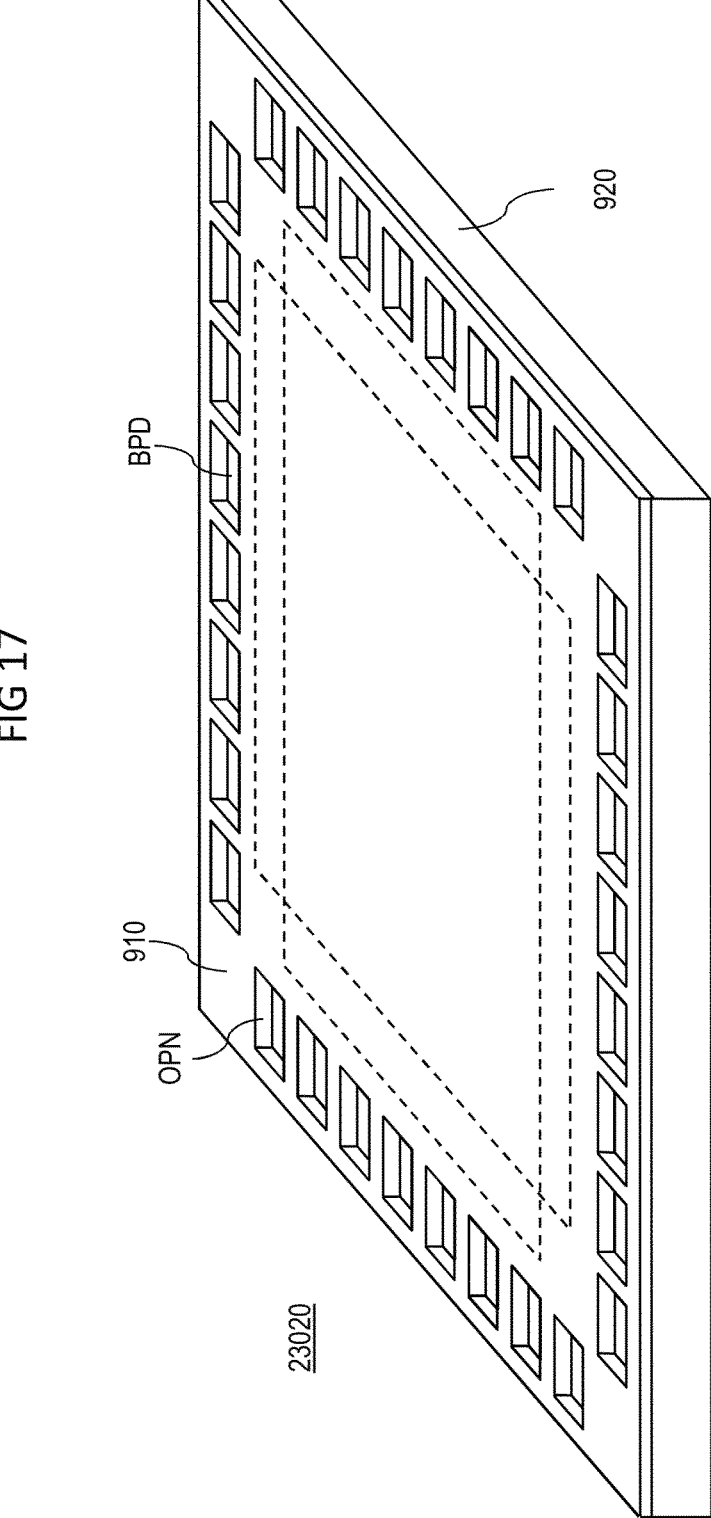
FIG. 17 is a schematic circuit diagram of elements of an image sensor array formed on a second chip of a solid-state imaging device with laminated structure according to an embodiment.

FIG. 17 is a perspective view showing an example of a laminated structure of a solid-state imaging device 23020 with a plurality of pixels arranged matrix-like in array form. Each pixel includes at least one photoelectric conversion element.

The solid-state imaging device 23020 has the laminated structure of a first chip (upper chip) 910 and a second chip (lower chip) 920. The laminated first and second chips 910, 920 may be electrically connected to each other through TC(S) Vs (Through Contact (Silicon) Vias) formed in the first chip 910. The solid-state imaging device 23020 may be formed to have the laminated structure in such a manner that the first and second chips 910 and 920 are bonded together at wafer level and cut out by dicing.

In the laminated structure of the upper and lower two chips, the first chip 910 may be an analog chip (sensor chip) including at least one analog component of each pixel circuit, e.g., the photoelectric conversion elements arranged in array form.

For example, the first chip 910 may include only the photoelectric conversion elements of the pixel circuits as described above with reference to the preceding FIGS. Alternatively, the first chip 910 may include further elements of each pixel circuit. For example, the first chip 910 may include, in addition to the photoelectric conversion elements, at least the transfer transistor, the reset transistor, the amplification transistor, and/or the selection transistor of the pixel circuits. Alternatively, the first chip 910 may include each element of the pixel circuit. In addition to the elements of the pixel circuits, the first chip 910 may include one, some or all elements of the ramp generator circuit as described above.

The second chip 920 may be mainly a logic chip (digital chip) that includes the elements complementing the elements on the first chip 910 to complete pixel circuits and current control circuits. The second chip 920 may also include analog circuits, for example circuits that quantize analog signals transferred from the first chip 910 through the TCVs. For example, the second chip 920 may include all or at least some of the components of the ramp generator circuit as described with reference to the preceding Figures.

The second chip 920 may have one or more bonding pads BPD and the first chip 910 may have openings OPN for use in wire-bonding to the second chip 920. The solid-state imaging device 23020 with the laminated structure of the two chips 910, 920 may have the following characteristic configuration:

The electrical connection between the first chip 910 and the second chip 920 is performed through, for example, the TCVs. The TCVs may be arranged at chip ends or between a pad region and a circuit region. The TCVs for transmitting control signals and supplying power may be mainly concentrated at, for example, the four corners of the solid-state imaging device 23020, by which a signal wiring area of the first chip 910 can be reduced.

The technology according to the present disclosure may be realized in a light receiving device mounted in a mobile body of any type such as automobile, electric vehicle, hybrid electric vehicle, motorcycle, bicycle, personal mobility, airplane, drone, ship, or robot.

Figure 18:
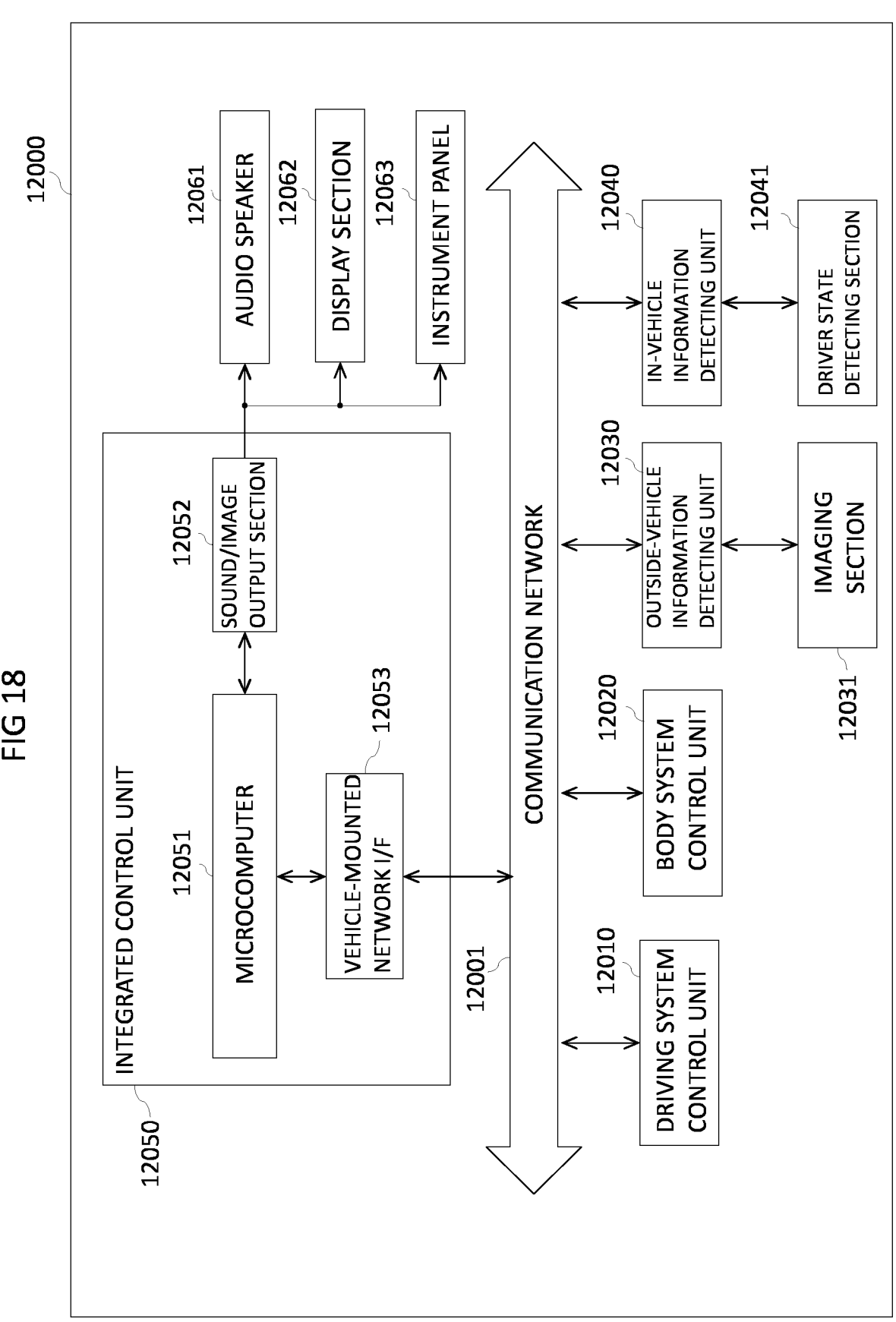
FIG. 18 is a block diagram depicting an example of a schematic configuration of a vehicle control system.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 imaging an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 may be or may include an image sensor that includes an ADC with a ramp generator circuit according to the embodiments of the present disclosure. The light received by the imaging section 12031 may be visible light, or may be invisible light such as infrared rays or the like.

The in-vehicle information detecting unit 12040 detects information about the inside of the vehicle and may be or may include a solid-state imaging device with a raw driver assembly according to the embodiments of the present disclosure. The in-vehicle information detecting unit 12040 is, for example, connected with a driver state detecting section 12041 that detects the state of a driver. The driver state detecting section 12041, for example, includes a camera that includes the solid-state imaging device and that is focused on the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or audible notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display or a head-up display, wherein each of them may include a solid-state imaging device with a ramp generator circuit as described with reference to the preceding Figures.

Figure 19:
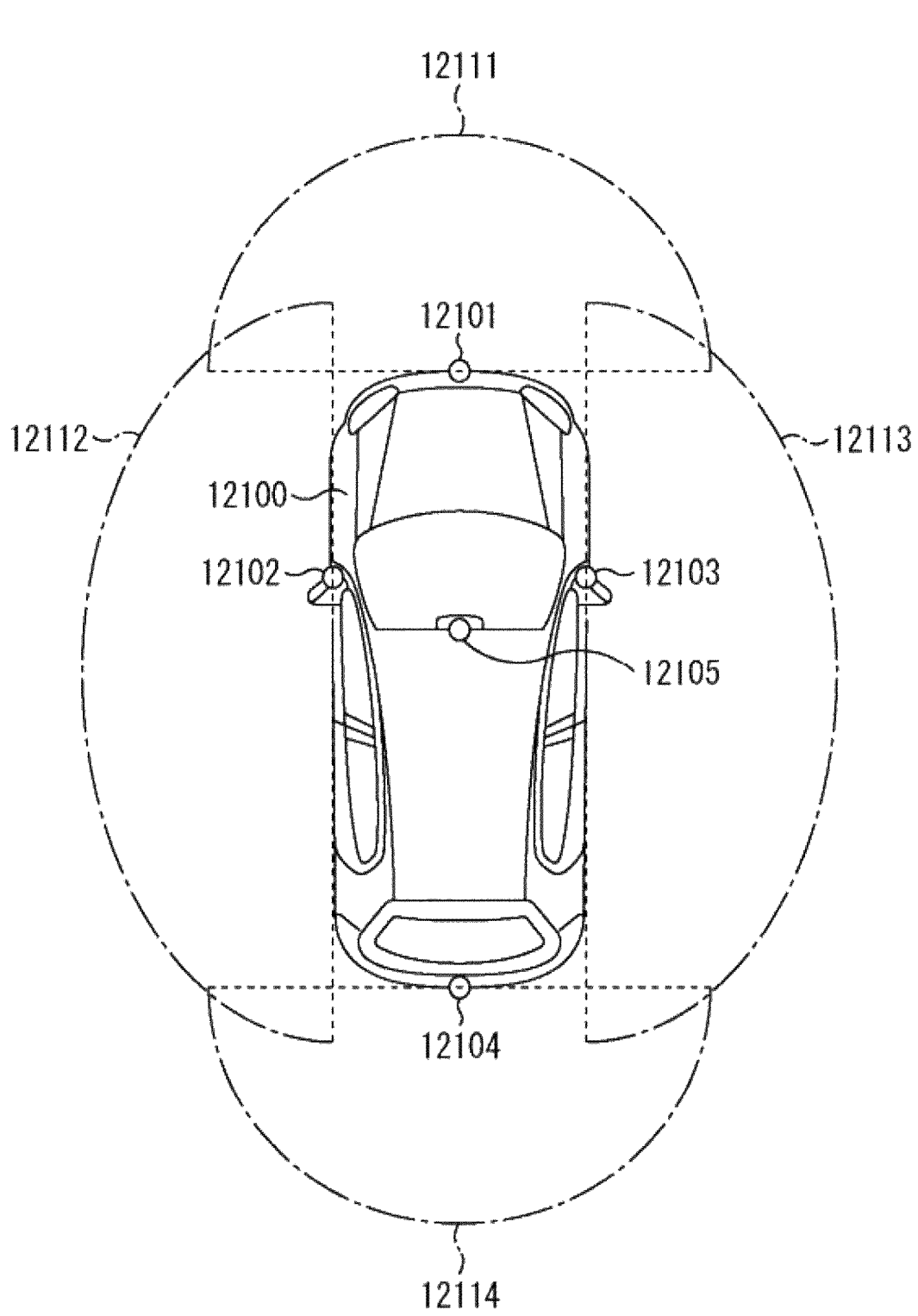
FIG. 19 is a diagram of assistance in explaining an example of installation positions of an outside-vehicle information detecting section and an imaging section of the vehicle control system of FIG. 18.

FIG. 19 is a diagram depicting an example of the installation position of the imaging section 12031, wherein the imaging section 12031 may include imaging sections 12101, 12102, 12103, 12104, and 12105.

The imaging sections 12101, 12102, 12103, 12104, and 12105 are, for example, disposed at positions on a front nose, side-view mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side view mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, imaging element having pixels for phase difference detection or may include a ToF module including a high dynamic range image sensor that includes an ADC with a ramp generator circuit according to the present disclosure.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to an embodiment of the present disclosure is applicable has been described above. By applying an image sensor that includes an ADC with a ramp generator circuit according to the present disclosure, the results of image recognition can be more reliable. For example, recognition of pedestrians can be performed on more reliable pixel information. A faulty image sensor can be reliably detected and reported to a higher instance.

Additionally, embodiments of the present technology are not limited to the above-described embodiments, but various changes can be made within the scope of the present technology without departing from the gist of the present technology.

A solid-state imaging device including an image sensor that includes an ADC with a ramp generator circuit according to the present disclosure may be any device used for analyzing and/or processing radiation such as visible light, infrared light, ultraviolet light, and X-rays. For example, the solid-state imaging device may be any electronic device in the field of traffic, the field of home appliances, the field of medical and healthcare, the field of security, the field of beauty, the field of sports, the field of agriculture, the field of image reproduction or the like.

Specifically, in the field of image reproduction, the solid-state imaging device may be a device for capturing an image to be provided for appreciation, such as a digital camera, a smart phone, or a mobile phone device having a camera function. In the field of traffic, for example, the solid-state imaging device may be integrated in an in-vehicle sensor that captures the front, rear, peripheries, an interior of the vehicle, etc. for safe driving such as automatic stop, recognition of a state of a driver, or the like, in a monitoring camera that monitors traveling vehicles and roads, or in a distance measuring sensor that measures a distance between vehicles or the like.

In the field of home appliances, the solid-state imaging device may be integrated in any type of sensor that can be used in devices provided for home appliances such as TV receivers, refrigerators, and air conditioners to capture gestures of users and perform device operations according to the gestures. Accordingly the solid-state imaging device may be integrated in home appliances such as TV receivers, refrigerators, and air conditioners and/or in devices controlling the home appliances. Furthermore, in the field of medical and healthcare, the solid-state imaging device may be integrated in any type of sensor, e.g. a solid-state image device, provided for use in medical and healthcare, such as an endoscope or a device that performs angiography by receiving infrared light.

In the field of security, the solid-state imaging device can be integrated in a device provided for use in security, such as a monitoring camera for crime prevention or a camera for person authentication use. Furthermore, in the field of beauty, the solid-state imaging device can be used in a device provided for use in beauty, such as a skin measuring instrument that captures skin or a microscope that captures a probe. In the field of sports, the solid-state imaging device can be integrated in a device provided for use in sports, such as an action camera or a wearable camera for sport use or the like. Furthermore, in the field of agriculture, the solid-state imaging device can be used in a device provided for use in agriculture, such as a camera for monitoring the condition of fields and crops.

The present technology can also be configured as described below:

(1) A solid-state imaging device, including: pixel circuits arranged in pixel columns, wherein for each pixel column, signal outputs of the pixel circuits are connected to a data signal line; comparator circuits, wherein each comparator circuit is configured to generate an active comparator signal in response to a voltage difference between a first comparator input and a second comparator input, and wherein each first comparator input is connected to one of the data signal lines; and a ramp generator circuit including at least one resistor network and buffer circuits, wherein the ramp generator circuit is configured to generate a voltage ramp signal based on voltages at voltage tap nodes of the at least one resistor network and wherein each buffer circuit is configured to pass a buffered voltage ramp signal to the second comparator input of at least one of the comparator circuits.

(2) The solid-state imaging device according to (1), wherein the ramp generator circuit includes a first part and a plurality of second parts, wherein the first part is configured to generate at least one internal voltage signal, and wherein each second part is configured to generate one of the buffered voltage ramp signals in response to the internal voltage signal.

(3) The solid-state imaging device according to any of (1) or (2), further including: switch matrix units, wherein each switch matrix unit includes electronic switches, and wherein each electronic switch is operable to connect one of the voltage tap nodes of the at least one resistor network with an input of one of the buffer circuits.

(4) The solid-state imaging device according to any of (1) to (3), further including: a reference voltage circuit configured to supply a reference voltage to a voltage tap node of at least one of the resistor networks.

(5) The solid-state imaging device according to any of (1) to (4), wherein the ramp generator circuit includes one resistor network, and wherein the ramp generator circuit is configured to switch the voltage tap nodes of the resistor network to the input of each buffer circuit.

(6) The solid-state imaging device according to (5), further including: a reference voltage circuit configured to supply a reference voltage to a voltage tap node of the resistor network.

(7) The solid-state imaging device according to any of (1) to (6), wherein the ramp generator circuit includes a plurality of resistor networks, and wherein the ramp generator circuit is configured to switch the voltage tap nodes of one of the resistor networks to the input of one of the buffer circuits.

(8) The solid-state imaging device according to (7), further including: a reference voltage circuit configured to supply a reference voltage to one voltage tap node of each resistor network.

(9) The solid-state imaging device according to (7), further including: reference voltage circuits, wherein each reference voltage circuit is configured to supply a reference voltage to a voltage tap node of one of the resistor networks.

(10) The solid-state imaging device according to any of (1) to (9), wherein each buffer circuit is configured to pass the buffered voltage ramp signal to the second comparator inputs of two or more of the comparator circuits.

(11) The solid-state imaging device according to any of (1) to (10), wherein each buffer circuit is configured to pass the buffered voltage ramp signal to the second comparator input of one of the comparator circuits.

(12) The solid-state imaging device according to any of (1) to (11), wherein each of the at least one resistor networks includes resistor elements electrically connected in series between a first supply node and a second supply node, and wherein the voltage tap nodes are formed between neighboring ones of the resistor elements.

(13) The solid-state imaging device according to any of (1) to (12), including at least two reference voltage circuits, wherein the at least two reference voltage circuits are electrically connected to different voltage tap nodes of at least one of the resistor networks.

(14) The solid-state imaging device according to (4), wherein the at least one reference voltage circuit includes a voltage generation circuit adapted to generate a reference voltage and an auxiliary buffer circuit adapted to buffer the generated reference voltage.

(15) The solid-state imaging device according to (4), wherein the at least one reference voltage circuit includes: a resistor string including resistance elements electrically connected in series between a first auxiliary supply node and a second auxiliary supply node, wherein reference circuit nodes are formed between electrically neighboring resistance elements; and reference voltage switches, wherein each reference voltage switch is operable to connect one of the reference circuit nodes with an input of the auxiliary buffer circuit.

The invention claimed is:

1. A solid-state imaging device, comprising:

pixel circuits arranged in pixel columns, wherein for each pixel column, signal outputs of the pixel circuits are connected to a data signal line;

comparator circuits, wherein each comparator circuit is configured to generate an active comparator signal in response to a voltage difference between a first comparator input and a second comparator input, and wherein each first comparator input is connected to one of the data signal lines; and a ramp generator circuit including at least one resistor network and buffer circuits, wherein the ramp generator circuit is configured to generate a voltage ramp signal based on voltages at voltage tap nodes of the at least one resistor network, wherein the ramp generator circuit includes a first circuit and a plurality of second resistor circuits, the first circuit is configured to generate at least one internal voltage signal, each second circuit is configured to generate one of the buffered voltage ramp signals in response to the internal voltage signal, and each buffer circuit is configured to pass a buffered voltage ramp signal to the second comparator input of at least one of the comparator circuits.

2. The solid-state imaging device according to claim 1, further comprising:

switch matrix circuits, wherein each switch matrix circuit includes electronic switches, and wherein each electronic switch is operable to connect one of the voltage tap nodes of the at least one resistor network with an input of one of the buffer circuits.

3. The solid-state imaging device according to claim 2, further comprising:

a ramp control circuit configured to control the electronic switches, wherein the ramp control circuit is configured to change a switching rate of the electronic switches at slope transition points.

4. The solid-state imaging device according to claim 1, further comprising:

a reference voltage circuit configured to supply a reference voltage to a voltage tap node of at least one of the resistor networks.

5. The solid-state imaging device according to claim 1, wherein the ramp generator circuit includes one resistor network, and wherein the ramp generator circuit is configured to switch the voltage tap nodes of the resistor network to the input of each buffer circuit.

6. The solid-state imaging device according to claim 5, further comprising:

a reference voltage circuit configured to supply a reference voltage to a voltage tap node of the resistor network.

7. The solid-state imaging device according to claim 1, wherein the ramp generator circuit includes a plurality of resistor networks, and wherein the ramp generator circuit is configured to switch the voltage tap nodes of one of the resistor networks to the input of one of the buffer circuits.

8. The solid-state imaging device according to claim 1, wherein each buffer circuit is configured to pass the buffered voltage ramp signal to the second comparator inputs of two or more of the comparator circuits.

9. The solid-state imaging device according to claim 1, wherein each buffer circuit is configured to pass the buffered voltage ramp signal to the second comparator input of one of the comparator circuits.

10. The solid-state imaging device according to claim 1, wherein each of the at least one resistor networks includes resistor elements electrically connected in series between a first supply node and a second supply node, and wherein the voltage tap nodes are formed between neighboring ones of the resistor elements.

11. The solid-state imaging device according to claim 1, further comprising at least two reference voltage circuits, wherein the at least two reference voltage circuits are electrically connected to different voltage tap nodes of at least one of the resistor networks.

12. The solid-state imaging device according to claim 1, wherein each buffer circuit includes a low-pass filter circuit configured to smooth the buffered voltage ramp signal.

13. The solid-state imaging device according to claim 1, wherein each buffer circuit includes a programmable gain amplifier having a reconfigurable feedback impedance network.

14. The solid-state imaging device according to claim 1, further comprising a laminated structure of a first chip and a second chip, wherein the pixel circuits are disposed on the first chip and at least a portion of the ramp generator circuit is disposed on the second chip.

15. A solid-state imaging device, comprising:

pixel circuits arranged in pixel columns, wherein for each pixel column, signal outputs of the pixel circuits are connected to a data signal line;

comparator circuits, wherein each comparator circuit is configured to generate an active comparator signal in response to a voltage difference between a first comparator input and a second comparator input, and wherein each first comparator input is connected to one of the data signal lines;

a ramp generator circuit including at least one resistor network and buffer circuits; and at least one reference voltage circuit configured to supply a reference voltage to a voltage tap node of at least one of the resistor networks, wherein the ramp generator circuit includes a plurality of resistor networks, the ramp generator circuit is configured to switch the voltage tap nodes of one of the resistor networks to the input of one of the buffer circuits, and each buffer circuit is configured to pass a buffered voltage ramp signal to the second comparator input of at least one of the comparator circuits.

16. The solid-state imaging device according to claim 15, wherein the at least one reference voltage circuit includes a voltage generation circuit adapted to generate a reference voltage and an auxiliary buffer circuit adapted to buffer the generated reference voltage.

17. The solid-state imaging device according to claim 15, wherein the at least one reference voltage circuit includes:

a resistor string including resistance elements electrically connected in series between a first auxiliary supply node and a second auxiliary supply node, wherein reference circuit nodes are formed between electrically neighboring resistance elements; and reference voltage switches, wherein each reference voltage switch is operable to connect one of the reference circuit nodes with an input of the auxiliary buffer circuit.

18. A solid-state imaging device, comprising:

pixel circuits arranged in pixel columns, wherein for each pixel column, signal outputs of the pixel circuits are connected to a data signal line;

comparator circuits, wherein each comparator circuit is configured to generate an active comparator signal in response to a voltage difference between a first comparator input and a second comparator input, and wherein each first comparator input is connected to one of the data signal lines; and a ramp generator circuit including at least one resistor network and buffer circuits, wherein the ramp generator circuit is configured to generate a voltage ramp signal based on voltages at voltage tap nodes of the at least one resistor network, wherein the ramp generator circuit includes a plurality of resistor networks, and wherein the ramp generator circuit is configured to switch the voltage tap nodes of one of the resistor networks to the input of one of the buffer circuit, and each buffer circuit is configured to pass a buffered voltage ramp signal to the second comparator input of at least one of the comparator circuits.

19. The solid-state imaging device according to claim 18, further comprising:

a reference voltage circuit configured to supply a reference voltage to one voltage tap node of each resistor network.

20. The solid-state imaging device according to claim 18, further comprising:

reference voltage circuits, wherein each reference voltage circuit is configured to supply a reference voltage to a voltage tap node of one of the resistor networks.

* * * * *